United States Patent
Blauvelt et al.

(10) Patent No.: US 10,074,959 B2
(45) Date of Patent: Sep. 11, 2018

(54) MODULATED LASER SOURCE AND METHODS OF ITS FABRICATION AND OPERATION

(71) Applicant: EMCORE Corporation, Alhambra, CA (US)

(72) Inventors: Henry A. Blauvelt, San Marino, CA (US); Xiaoguang He, Diamond Bar, CA (US); Kerry Vahala, Pasadena, CA (US)

(73) Assignee: EMCORE CORPORATION, Alhambra, CA (US)

( * ) Notice: Subject to any disclaimer, the term of this patent is extended or adjusted under 35 U.S.C. 154(b) by 0 days.

(21) Appl. No.: 15/227,908

(22) Filed: Aug. 3, 2016

(65) Prior Publication Data
US 2018/0041006 A1    Feb. 8, 2018

(51) Int. Cl.
*H01S 5/042*    (2006.01)
*H01S 5/20*    (2006.01)
(Continued)

(52) U.S. Cl.
CPC ............ *H01S 5/042* (2013.01); *H01S 5/0265* (2013.01); *H01S 5/0425* (2013.01);
(Continued)

(58) Field of Classification Search
CPC .................. H01S 5/022; H01S 5/0265; H01S 5/0625–5/06253;
(Continued)

(56) References Cited

U.S. PATENT DOCUMENTS

| 4,573,158 A | 2/1986 | Utaka et al. |
| 4,660,206 A * | 4/1987 | Halmos ................. H01S 3/1398 372/12 |

(Continued)

FOREIGN PATENT DOCUMENTS

| EP | 0 556 974 | 8/1993 |
| EP | 0627798 A1 | 12/1994 |

(Continued)

OTHER PUBLICATIONS

Sahara et al; Single contact monolithically integrated DFB laser amplifier; IEEE Photonics Technology Letters, vol. 14, No. 7, pp. 899-901; Jul. 2002; doi: 10.1109/LPT.2002.1012378.

(Continued)

*Primary Examiner* — Joshua King
(74) *Attorney, Agent, or Firm* — David S. Alavi

(57) ABSTRACT

A modulated semiconductor laser source includes a waveguide on a semiconductor substrate; first and second reflectors; a laser electrode; an optical modulator; and a laser-electrode electrical circuit. The reflectors and a resonator segment of the waveguide define a laser resonator with laser output transmitted through the second reflector. The laser electrode is positioned over the resonator segment and a laser current flows through the laser electrode into the resonator segment to produce optical gain. The modulator receives and modulates the laser output, in response to a primary modulation signal, to produce a modulated output optical signal. The laser-electrode circuit is coupled to the laser electrode and derives from the primary modulation signal a laser-electrode secondary modulation current, optimized to reduce chirp in the modulated output signal, that flows through the laser electrode into or out of the resonator segment in addition to the laser current.

43 Claims, 15 Drawing Sheets

(51) Int. Cl.
   *H01S 5/10*     (2006.01)
   *H01S 5/026*    (2006.01)
   *H01S 5/12*     (2006.01)
   *H01S 5/0625*   (2006.01)

(52) U.S. Cl.
   CPC ........ *H01S 5/0427* (2013.01); *H01S 5/06258* (2013.01); *H01S 5/1028* (2013.01); *H01S 5/1203* (2013.01); *H01S 5/20* (2013.01)

(58) Field of Classification Search
   CPC .............. H01S 5/06255–5/06258; H01S 5/0427–5/0428; H01S 5/0261
   See application file for complete search history.

(56) References Cited

U.S. PATENT DOCUMENTS

| | | | |
|---|---|---|---|
| 4,669,086 A * | 5/1987 | Kaede | H01S 3/137 372/32 |
| 4,905,253 A | 2/1990 | Chraplyvy et al. | |
| 4,912,716 A * | 3/1990 | Mead | H01S 3/1303 372/12 |
| 5,020,153 A | 5/1991 | Choa et al. | |
| 5,119,393 A | 6/1992 | Oka et al. | |
| 5,170,402 A | 12/1992 | Ogita et al. | |
| 5,228,049 A | 7/1993 | Paoli | |
| 5,255,276 A | 10/1993 | Tabuchi et al. | |
| 5,325,225 A * | 6/1994 | Suzuki | H04B 10/505 372/26 |
| 5,373,385 A | 12/1994 | Darcie et al. | |
| 5,432,123 A | 7/1995 | Dentai et al. | |
| 5,502,741 A * | 3/1996 | Carroll | H01S 5/0625 372/26 |
| 5,590,145 A | 12/1996 | Nitta | |
| 5,659,560 A * | 8/1997 | Ouchi | B82Y 20/00 372/27 |
| 5,680,411 A | 10/1997 | Ramdane et al. | |
| 5,699,179 A | 12/1997 | Gopalakrishnan | |
| 5,742,418 A * | 4/1998 | Mizutani | H04B 10/532 372/27 |
| 5,790,581 A | 8/1998 | Nitta | |
| 5,926,493 A | 7/1999 | O'Brien et al. | |
| 5,960,014 A | 9/1999 | Li et al. | |
| 5,991,061 A * | 11/1999 | Adams | H01S 5/06258 372/96 |
| 5,991,323 A | 11/1999 | Adams et al. | |
| 6,031,860 A | 2/2000 | Nitta et al. | |
| 6,166,837 A * | 12/2000 | Adams | H01S 5/06258 359/249 |
| 6,167,172 A | 12/2000 | Kunkee et al. | |
| 6,252,693 B1 * | 6/2001 | Blauvelt | H04B 10/2537 398/163 |
| 6,304,353 B1 * | 10/2001 | Gehlot | H04B 10/532 398/158 |
| 6,535,315 B1 * | 3/2003 | Way | H04B 10/2537 398/182 |
| 6,646,775 B2 | 11/2003 | Ishizaka | |
| 6,700,910 B1 | 3/2004 | Aoki et al. | |
| 7,437,029 B2 | 10/2008 | Joyner et al. | |
| 7,573,928 B1 | 8/2009 | Pezeshki | |
| 7,680,169 B2 | 3/2010 | Park et al. | |
| 7,991,291 B2 | 8/2011 | Matsui et al. | |
| RE44,647 E * | 12/2013 | Iannelli | H04B 10/504 398/186 |
| 9,059,801 B1 | 6/2015 | Blauvelt et al. | |
| 9,306,372 B2 | 4/2016 | Blauvelt et al. | |
| 9,306,672 B2 | 4/2016 | Blauvelt et al. | |
| 9,438,007 B2 | 9/2016 | Blauvelt et al. | |
| 9,564,733 B2 | 2/2017 | Blauvelt et al. | |
| 9,564,734 B2 | 2/2017 | Blauvelt et al. | |
| 2002/0097941 A1 | 7/2002 | Forrest et al. | |
| 2002/0131466 A1 | 9/2002 | Salvatore et al. | |
| 2002/0158266 A1 | 10/2002 | Sato et al. | |
| 2002/0181516 A1 * | 12/2002 | Kamath | H01S 5/06256 372/20 |
| 2003/0063646 A1 | 4/2003 | Yoshida | |
| 2003/0091086 A1 | 5/2003 | Sahara et al. | |
| 2003/0095737 A1 * | 5/2003 | Welch | B82Y 20/00 385/14 |
| 2003/0185257 A1 | 10/2003 | Suzuki et al. | |
| 2003/0210723 A1 | 11/2003 | Adams et al. | |
| 2004/0042069 A1 | 3/2004 | Fisher | |
| 2004/0081212 A1 | 4/2004 | Schrodinger | |
| 2004/0086012 A1 | 5/2004 | Kitaoka et al. | |
| 2004/0218931 A1 | 11/2004 | Frederiksen et al. | |
| 2004/0228384 A1 | 11/2004 | Oh et al. | |
| 2004/0228637 A1 | 11/2004 | Lee et al. | |
| 2004/0264525 A1 * | 12/2004 | Senga | H01S 5/06256 372/38.1 |
| 2005/0013332 A1 | 1/2005 | Kish et al. | |
| 2005/0018732 A1 | 1/2005 | Bond et al. | |
| 2005/0041699 A1 | 2/2005 | White et al. | |
| 2005/0249509 A1 | 11/2005 | Nagarajan et al. | |
| 2006/0045145 A1 | 3/2006 | Arahira | |
| 2006/0120416 A1 | 6/2006 | Hu et al. | |
| 2006/0209911 A1 | 9/2006 | Takabayashi | |
| 2006/0285570 A1 | 12/2006 | Xuan et al. | |
| 2007/0081565 A1 * | 4/2007 | Sasada | H04B 10/504 372/28 |
| 2007/0116398 A1 | 5/2007 | Pan et al. | |
| 2007/0134002 A1 | 6/2007 | Arahira | |
| 2007/0228551 A1 * | 10/2007 | Ishikawa | H01S 5/0612 257/701 |
| 2007/0237193 A1 * | 10/2007 | Finzi | H01S 5/0265 372/28 |
| 2008/0025358 A1 | 1/2008 | Arahira | |
| 2008/0138088 A1 | 6/2008 | Welch et al. | |
| 2008/0219315 A1 | 9/2008 | Makino et al. | |
| 2008/0291952 A1 | 11/2008 | Yamamoto et al. | |
| 2010/0266289 A1 | 10/2010 | Devgan et al. | |
| 2011/0091146 A1 | 4/2011 | Knights et al. | |
| 2011/0134957 A1 | 6/2011 | Su et al. | |
| 2011/0150484 A1 | 6/2011 | Wang | |
| 2012/0002694 A1 | 1/2012 | Bowers et al. | |
| 2012/0099185 A1 | 4/2012 | Yokoyama et al. | |
| 2012/0128375 A1 | 5/2012 | Kimoto et al. | |
| 2012/0163405 A1 | 6/2012 | Su et al. | |
| 2012/0243874 A1 | 9/2012 | Logan et al. | |
| 2013/0021891 A1 | 1/2013 | Fujita et al. | |
| 2014/0270788 A1 * | 9/2014 | Blauvelt | H01S 5/026 398/116 |
| 2015/0155683 A1 * | 6/2015 | Blauvelt | H01S 5/06251 385/2 |
| 2016/0006509 A1 | 1/2016 | Blauvelt et al. | |
| 2016/0204870 A1 | 7/2016 | Blauvlet et al. | |

FOREIGN PATENT DOCUMENTS

| | | |
|---|---|---|
| EP | 0917260 A1 | 5/1999 |
| JP | 2008-034657 | 2/2008 |
| JP | 2012-094622 A | 5/2012 |
| WO | WO 2002/058251 | 7/2002 |

OTHER PUBLICATIONS

Maywar et al; Effect of chirped gratings on reflective optical bistability in DFB semiconductor laser amplifiers; IEEE Journal of Quantum Electronics, vol. 34, No. 12, pp. 2364-2370; Dec. 1998; doi: 10.1109/3.736108.

Brosson; Semiconductor lasers and integrated devices; EDP Sciences 2002; DOI: 10.1051/bib-sfo:2002059; pp. 1-53.

Thedrez et al; Power and facet phase dependence of chirp for index and gain-coupled DFB lasers; IEEE 16th International Semiconductor Laser Conference, Oct. 4-8, 1998. ISLC 1998 NARA, pp. 175-176; doi: 10.1109/ISLC.1998.734193.

Jabbari et al; XPM Response of Multiple Quantum Well chirped DFB-SOA All Optical Flip-Flop Switching; World Academy of Science, Engineering & Technology 56 2009 pp. 696-700.

(56) References Cited

OTHER PUBLICATIONS

Woodward et al; A method for reducing multipath interference noise; IEEE Photonics Technology Letters, vol. 6, No. 3, pp. 450-452; Mar. 1994; doi: 10.1109/68.275515.
Co-owned U.S. Appl. No. 14/740,241, filed Jun. 15, 2015 in the names of Blauvelt et al.
Co-owned U.S. Appl. No. 15/081,575, filed Mar. 25, 2016 in the names of Blauvelt et al.
Co-owned U.S. Appl. No. 15/090,565, filed Apr. 4, 2016 in the names of Blauvelt et al.
Search Report dated Oct. 5, 2015 in counterpart App No. EP 14020022.
Gerlach et al; Indium Phosphide & Related Materials Conf 2005; May 8, 2005; pp. 554-557; DOI:10.1109/ICIPRM.2005.1517557.
He; IEEE Photonoc Technology Letters; vol. 19 No. 5 p. 285 (Mar. 1, 2007).
Search Report dated Nov. 30, 2015 in co-owned App No PCT/US2015/050161.
Search Report dated Sep. 21, 2017 in co-owned App No PCT/US2017/045343.

\* cited by examiner

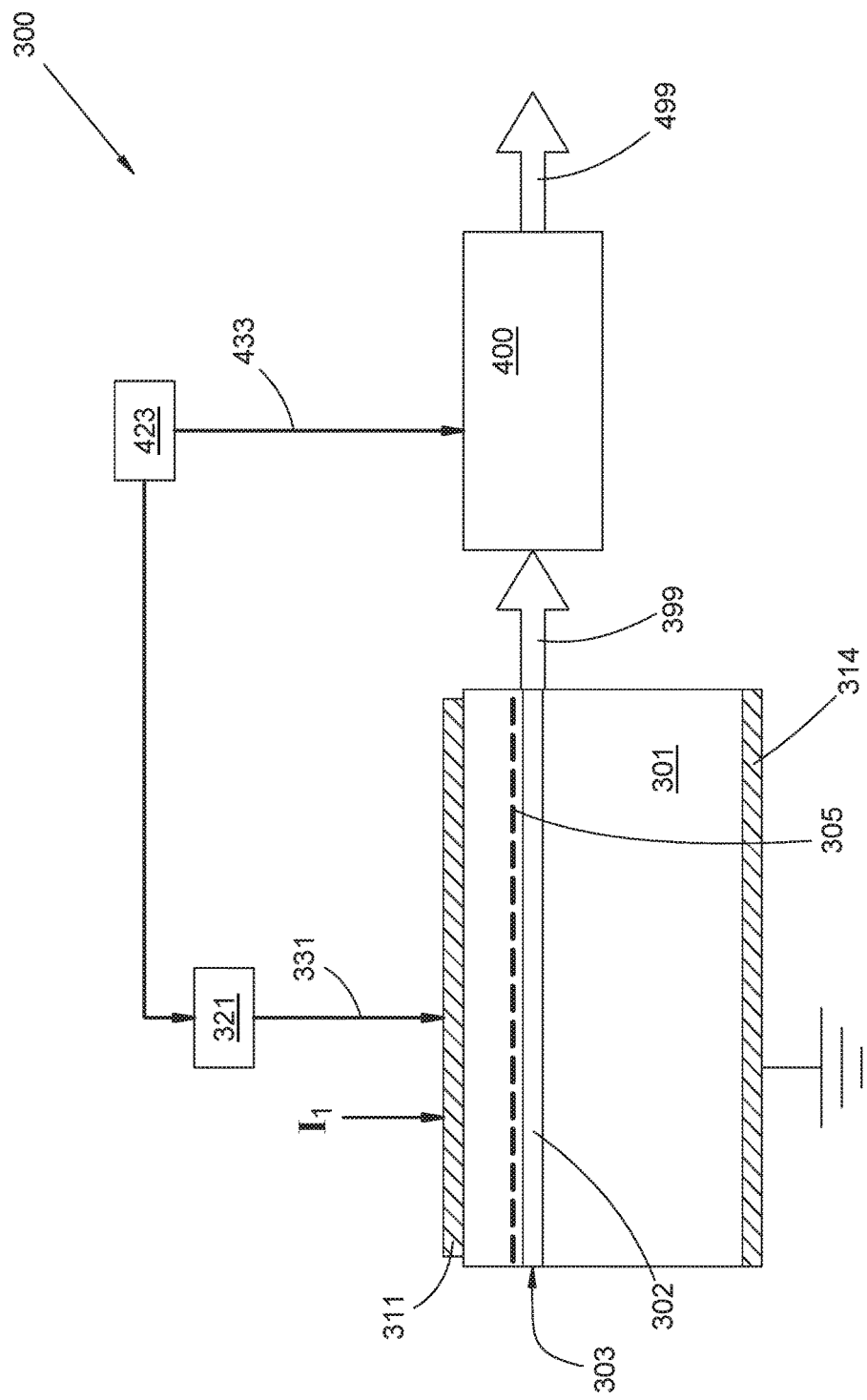

MODULATED LASER SOURCE AND METHODS OF ITS FABRICATION AND OPERATION

This application is related to subject matter disclosed in: (i) U.S. non-provisional application Ser. No. 15/090,565 filed Apr. 4, 2016 in the names of Henry A. Blauvelt, Xiaoguang He, and Kerry Vahala (now U.S. Pat. No. 9,564,733); (ii) U.S. non-provisional application Ser. No. 14/620,010 filed Feb. 11, 2015 in the names of Henry A. Blauvelt, Xiaoguang He, and Kerry Vahala (now U.S. Pat. No. 9,306,372); (iii) U.S. provisional App. No. 62/050,347 filed Sep. 15, 2014 in the name of Henry A. Blauvelt; (iv) U.S. non-provisional application Ser. No. 13/831,334 filed Mar. 14, 2013 in the names of Henry A. Blauvelt, Xiaoguang He, and Kerry Vahala (now U.S. Pat. No. 9,059,801); (v) U.S. non-provisional application Ser. No. 14/086,112 filed Nov. 21, 2013 in the names of Henry A. Blauvelt, Xiaoguang He, and Kerry Vahala (now U.S. Pat. No. 9,306,672); (vi) U.S. non-provisional application Ser. No. 14/740,241 filed Jun. 15, 2015 in the names of Henry A. Blauvelt, Xiaoguang He, and Kerry Vahala (now U.S. Pat. No. 9,438,007); and (vii) U.S. non-provisional application Ser. No. 15/081,575 filed Mar. 25, 2016 in the names of Henry A. Blauvelt, Xiaoguang He, and Kerry Vahala (now U.S. Pat. No. 9,564,734). Each of said applications is incorporated by reference as if fully set forth herein; said applications are referred to collectively herein as "the incorporated references" or "the references incorporated in the background."

FIELD OF THE INVENTION

This invention relates to an externally modulated semiconductor laser source for producing optical signals modulated to carry analog or digital radio frequency (RF) signals through an optical transmission system.

BACKGROUND

One link of an optical telecommunication system typically has a transmitter, an optical fiber, and a receiver. The optical transmitter includes a modulated laser source, which converts an electrical signal into a modulated optical signal and launches it into the optical fiber. The optical fiber transports the optical signal to the receiver. The receiver converts the modulated optical signal back into an electrical signal. Typically the electrical signal takes the form of an RF electrical signal that encodes information to be transmitted; the optical signal is modulated by the RF signal to carry the information along an optical fiber.

An optical transmitter for the transmission of an analog or digital radio-frequency (RF) signal over an optical fiber can use a directly modulated laser or a continuous wave (CW) laser coupled to an external modulator. Directly modulating the analog intensity of a light-emitting diode (LED) or semiconductor laser with an electrical signal is among the simplest methods for transmitting analog signals, such as voice and video signals, over optical fibers. Although such analog transmission techniques have the advantage of substantially smaller bandwidth requirements than digital transmission, such as digital pulse code modulation, or analog or pulse frequency modulation, the use of amplitude modulation typically places more stringent requirements on the noise and distortion characteristics of the transmitter. A limiting factor in such links can be the second order distortion due to the combination of optical frequency modulation (i.e., chirp) and optical fiber dispersion.

For these reasons, direct modulation techniques have typically been used in connection with 1310 nm lasers used for relatively short transmission links that employ optical fiber with relatively low dispersion. It is also possible to use direct modulation of 1550 nm lasers, but in this case the distortion produced by chirp and dispersion typically must be cancelled using a programmable predistorter that is set for the specific fiber length. In some case, such as when the signal must be sent to more than one location or through redundant fiber links of different lengths, such a predistorter can be undesirable. To avoid the distortion problems related to chirp and dispersion at 1550 nm with direct modulation, low chirp external optical modulators are commonly used in analog fiber optic communication systems, such as CATV signal distribution, to amplitude modulate an optical carrier with an information or content-containing signal, such as audio, video, or data signals.

Since the present disclosure also relates to external optical modulators associated with a laser, a brief background on external optical modulators is noted here. There are two general types of external optical modulators implemented as semiconductor devices known in the prior art: Mach Zehnder (MZ) modulators and electro-absorption (EA) modulators. A Mach-Zehnder modulator splits the optical beam into two arms or paths on the semiconductor device, one arm of which incorporates a phase modulator. The beams are then recombined which results in interference of the two wavefronts, thereby amplitude modulating the resulting light beam as a function of the modulated bias signal applied to the phase modulated arm. An electro-absorption modulator is implemented as a waveguide in a semiconductor device in which the absorption spectrum in the waveguide is modulated by an applied electric bias field, which changes the band gap energy in that region of the semiconductor, thereby modulating the amplitude or intensity of the light beam traversing the waveguide.

Stimulated Brillouin scattering (SBS) effects that depend on the optical launch power and the total fiber length may also degrade fiber optic system performance. SBS is an opto-acoustic nonlinear process that can occur in single mode optical fibers. This optically induced acoustic resonance effectively limits the amount of optical power that can be successfully transmitted through the single mode optical fiber within a given bandwidth.

The SBS can perhaps be best explained in terms of three waves in an optical fiber. When an incident wave (also known as the "pump wave") propagating along the optical fiber reaches a threshold power (which may vary), it excites an acoustic wave in the optical fiber. The optical properties of the optical fiber such as the refractive index are altered by the acoustic wave, and the fluctuation in the refractive index scatters the incident wave, thereby generating a reflected wave (also known as the "Stokes wave") that propagates in the opposite direction.

Because of the scattering, power is transferred from the incident wave to the reflected wave, and molecular vibrations in the optical fiber absorb the lost energy; the reflected wave has a lower optical frequency than the incident wave. The scattering effect can result in attenuation, power saturation and/or backward-propagation, each of which deteriorates the DWDM system performance. The attenuation is caused by the transfer of power from the incident wave to the acoustic and reflected waves; due to power saturation, there is a limit to the maximum amount of power that can be transmitted over the optical fiber; the backward propagation wave can create noise in transmitters and saturate amplifiers.

The phenomenon of SBS has been known by optical network equipment designers for a number of years. SBS results when a threshold power level is exceeded within a sufficiently narrow frequency band in a fiber optic light guide. The increasing operational relevance of SBS relates to the development of lasers such as, for example, single longitudinal mode lasers which can readily provide an output that exceeds the SBS threshold (e.g., typically about 4 mW within an optical bandwidth of about 25 MHz over about 50 km of single-mode optical fiber). Moreover, limitation of optical power to a level as low as 4 mW not only fails to utilize the output power available from state of the art lasers, but limits distance transmission through fiber optic cable by an unacceptable margin.

Various approaches to minimize the effect of SBS are also known. In general, SBS impact can be reduced in an externally modulated analog system if the optical signal's spectrum can be broadened, thereby lowering optical power per unit bandwidth. Some effective and widely used techniques for combating SBS include the use of an optical phase modulator or dithering the laser frequency or both, in the case of externally modulated laser sources.

SUMMARY

An example of a modulated semiconductor laser source comprises: (a) an optical waveguide formed on a semiconductor substrate; (b) first and second optical reflectors; (c) a laser electrode; (d) an optical modulator; and (e) a laser-electrode electrical circuit. The first and second optical reflectors are arranged on the substrate or waveguide, and with a resonator segment of the waveguide define a laser resonator arranged so that laser output from the laser resonator is transmitted through the second reflector. The laser electrode is positioned over at least a portion, of length $L_1$, of the resonator segment of the waveguide. The laser electrode is arranged so as to enable a substantially constant laser current $I_1$ to flow through the laser electrode into the resonator segment of the waveguide and produce optical gain therein. The optical modulator is optically coupled to the laser resonator so as to receive at least a portion of the laser output and to modulate the laser output, in response to a time-varying primary modulation signal applied to the optical modulator, to produce a modulated output optical signal. The laser-electrode electrical circuit is coupled to the laser electrode and arranged so as to derive from the primary modulation signal a time-varying laser-electrode secondary modulation current. The laser-electrode secondary modulation current flows through the laser electrode into or out of the resonator segment of the waveguide in addition to the laser current $I_1$ that flows into the resonator segment of the waveguide.

Objects and advantages pertaining to modulated laser sources may become apparent upon referring to the example embodiments illustrated in the drawings and disclosed in the following written description or appended claims, and shall fall within the scope of the present disclosure or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 12A-12E and 13 are cross-sectional views of various examples of an inventive modulated laser source according to the present disclosure.

Figure 1:
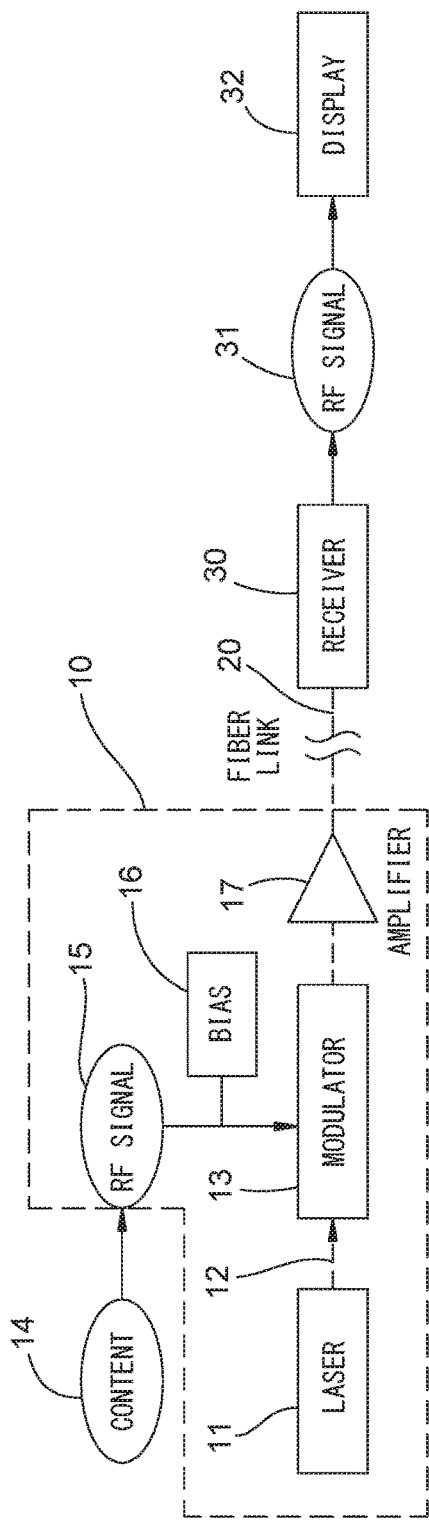
FIG. 1 is an example of a conventional externally modulated optical transmission system known in the prior art.

The embodiments depicted are shown only schematically; all features may not be shown in full detail or in proper proportion, certain features or structures may be exaggerated relative to others for clarity, and the drawings should not be regarded as being to scale. The embodiments shown are only examples; they should not be construed as limiting the scope of the present disclosure or appended claims.

DETAILED DESCRIPTION OF EMBODIMENTS

Various example embodiments of various inventive modulated semiconductor laser sources 300 are illustrated schematically in FIGS. 12A through 12E. Each example modulated semiconductor laser source 300 comprises an optical waveguide 302 formed on a semiconductor substrate 301, first and second reflectors 303/304/305, one or two laser electrodes 311/312; an optical modulator 400, and one or two laser-electrode electrical circuits 321/322.

The waveguide 302 can be of any suitable type or arrangement, and can include one or more upper or lower cladding layers in addition to one or more active layers. The one or more active layers of the waveguide 302 provide position-dependent optical gain or loss for an optical signal within an operating wavelength range of the laser source that propagates along the waveguide 302. Note that the phrase "propagating along the waveguide" means that the waveguide supports one or more propagating optical modes, and that the optical signal propagates in one or more of those supported modes. The position-dependent optical gain or loss varies according to a position-dependent level of electrical current density flowing into or out of the optical waveguide 302. Any operating wavelength range can be employed; operating wavelengths in the visible and near IR portions of the electromagnetic spectrum are commonly employed for fiber-optic telecommunications applications for which the inventive modulated laser source is primarily intended. The substrate 301 and waveguide 302 can comprise any suitable semiconductor materials, which typically are at least partly dictated by the desired operating wavelength range. Common semiconductor laser sources operate in the visible or near IR (e.g., between about 400 nm and about 2500 nm); common wavelength ranges employed in fiber-optic telecommunications are in the near IR (e.g., between about 800 nm and about 900 nm, between about 1200 nm and about 1700 nm, between about 1520 nm and about 1570 nm, or between about 1570 nm and about 1620 nm). For operating at such wavelengths, indium phosphide (InP; doped or undoped) is a common material for the substrate 301, and various III-V semiconductor materials or alloys thereof (e.g., InGaAs, InGaAsP, InAlGaAs, and so forth; often arranged as one or more heterostructures or quantum well structures) are commonly employed to form the waveguide 302. Any suitable semiconductor materials can be employed, for use over in any suitable operating wavelength range.

One end face (rear) of the substrate 301 and the waveguide 302 can be arranged as a reflective surface, and can be formed in any suitable way (e.g., cleaving, cutting, etching, polishing, and so forth). The reflective surface exhibits relatively high optical reflectivity and acts as the first optical reflector 303. Over at least the operating wavelength range, an optical signal, propagating along the waveguide 302 in a rearward direction (i.e., toward the first optical reflector 303), is at least partly reflected by the optical reflector 303. The reflected portion of the optical signal propagates along the waveguide 302 in a forward direction (i.e., away from the optical reflector 303). In some instances index contrast between the substrate 301 and its surroundings can provide sufficient reflectivity via Fresnel reflection; in other instances a suitable reflective coating can be applied to the reflective end face (e.g., metal, dielectric, multilayer, and so forth). Other suitable reflector types can be employed, including those not necessarily formed on the end face of the substrate 301 or waveguide 302 (e.g., a distributed Bragg reflector).

Figure 12A:
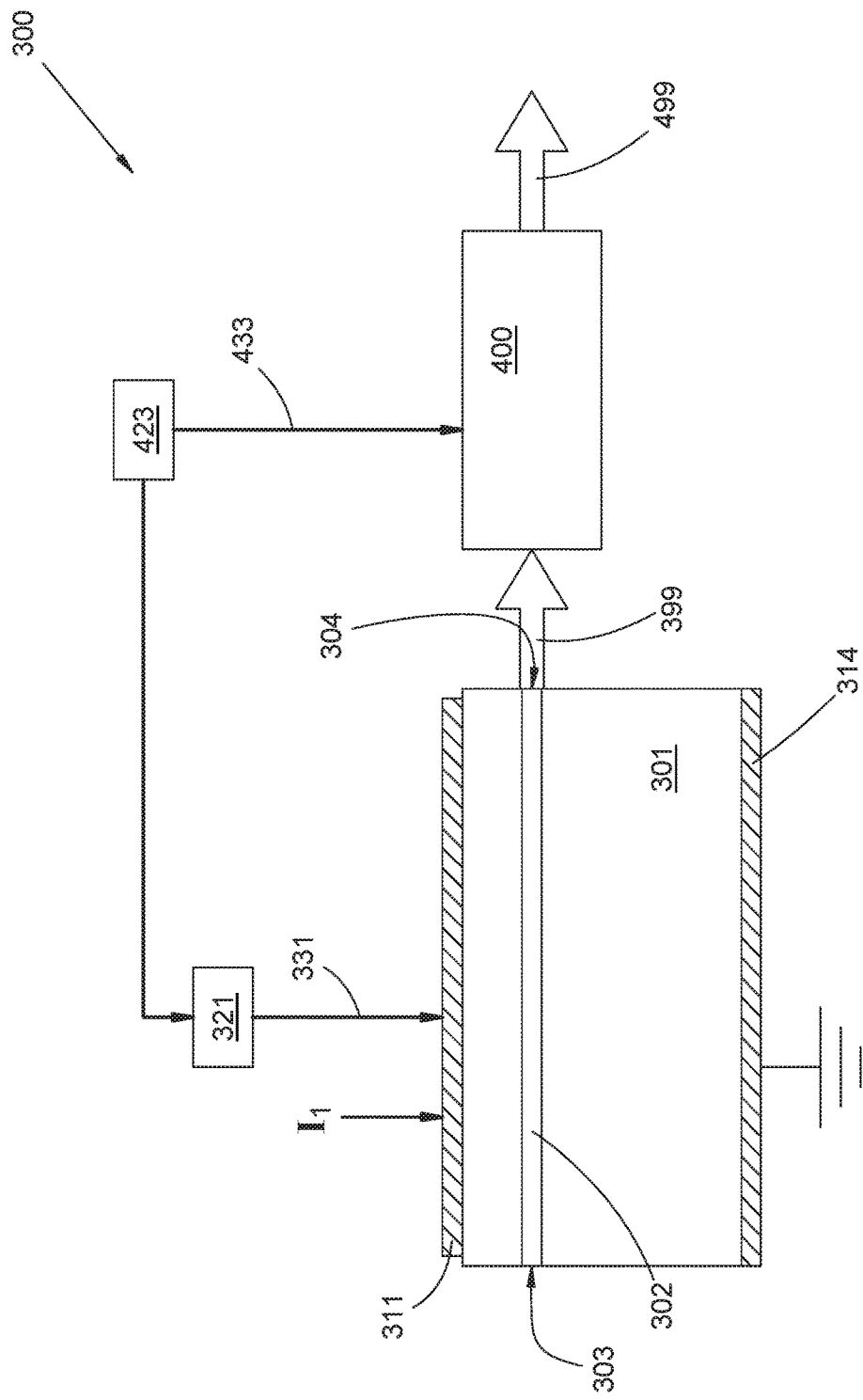
Figure 12B:
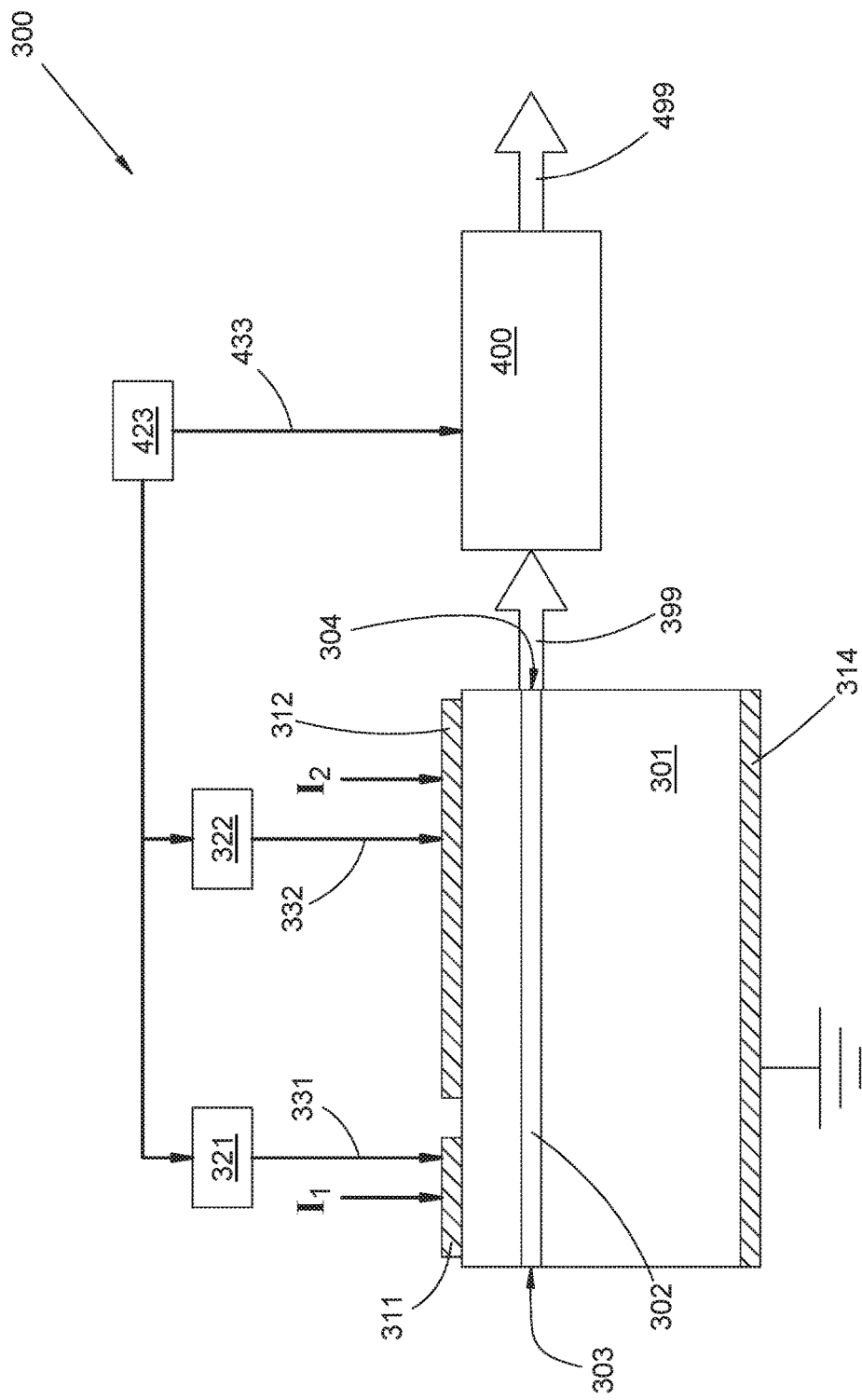

In the examples of FIGS. 12A and 12B, a second (front) end face of the substrate 301 is arranged as a second optical reflector 304, typically in a manner similar to that of the first optical reflector 303 (e.g., a cut, cleaved, etched, or polished surface of the substrate 301, with or without a coating, or as a distributed Bragg reflector). A resonator segment of the waveguide 302 (i.e., between the reflectors 303 and 304) and the first and second optical reflectors 303/304 define a Fabry-Perot laser resonator; the second optical reflector 304 is arranged to transmit a portion of light propagating forward along the waveguide 302, so as to act as an output coupler by transmitting the laser output 399 produced by the laser resonator.

Figure 12C:
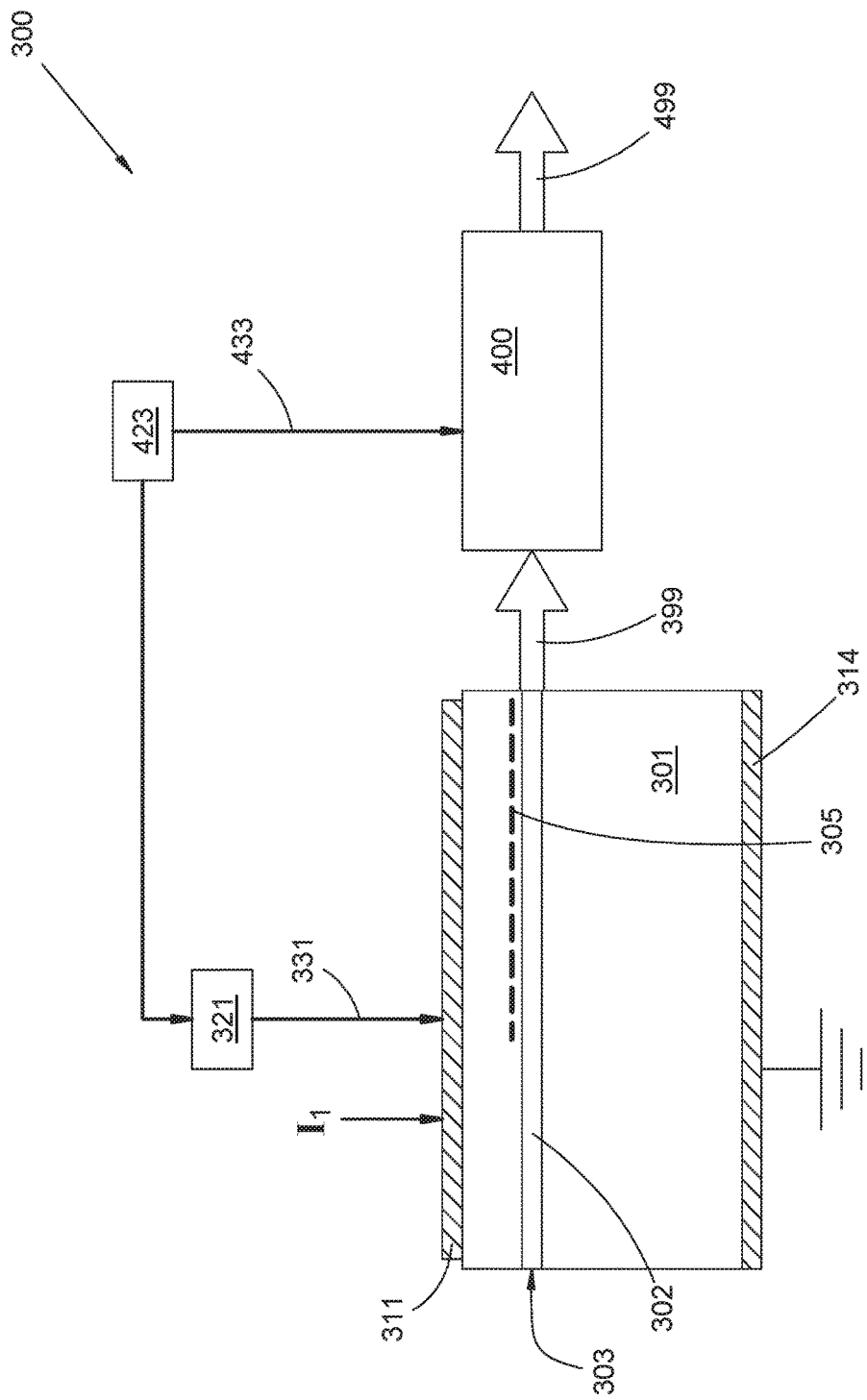
Figure 12D:
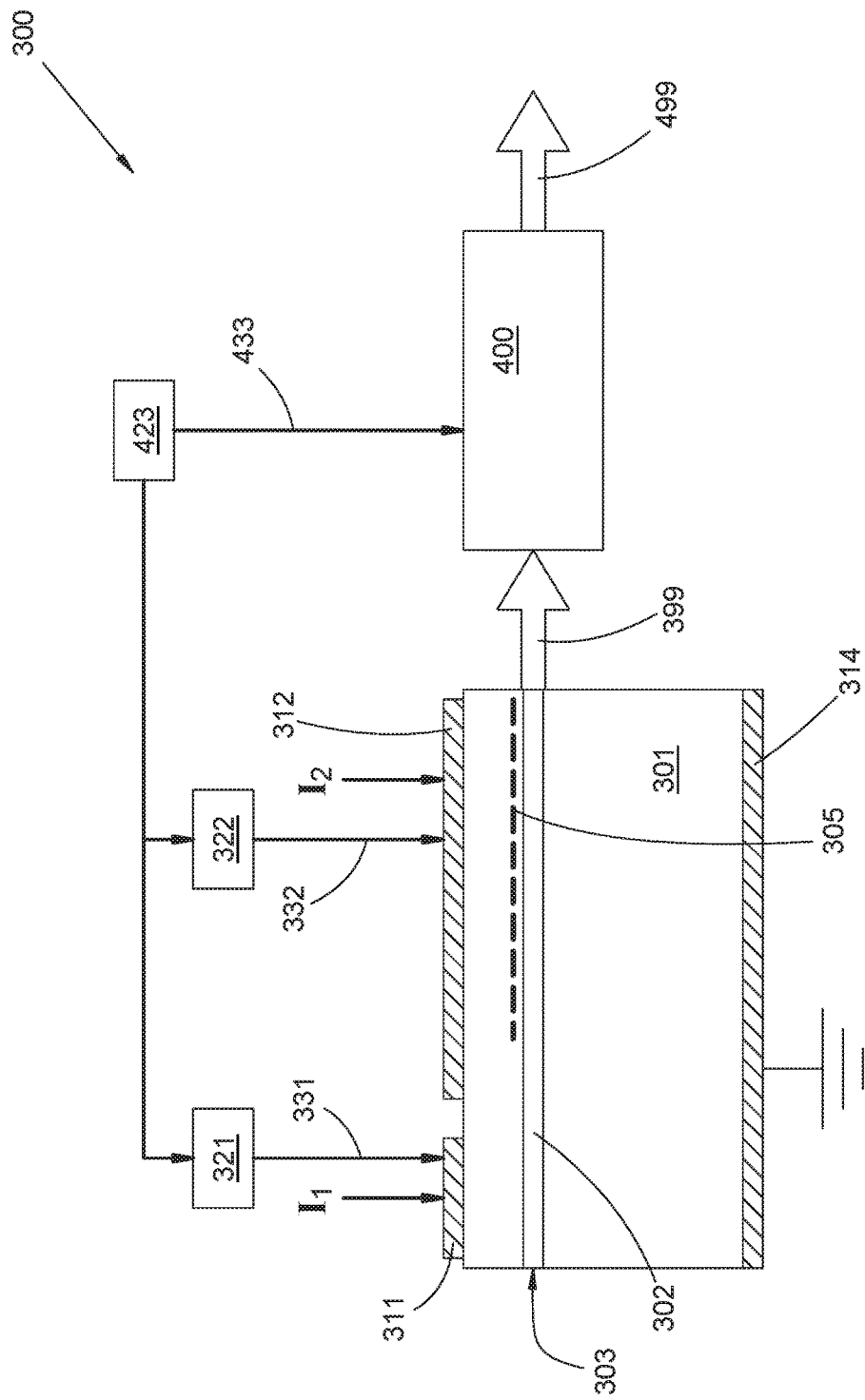

In the examples of FIGS. 12C through 12E, an optical grating 305 is formed or arranged on the substrate 301 or the waveguide 302 in any suitable way (e.g., by spatially selective densification, doping, deposition, etching, or other processing of one or more layers of the substrate 301 or the waveguide 302) to form a periodic variation of modal index along the length of the grating 305. The optical grating 305 diffracts, over at least a portion of the operating wavelength range, at least a portion of an optical signal propagating along the waveguide 302 in the forward direction. The diffracted portion propagates in the rearward direction along the waveguide 302 toward the optical reflector 303. A resonator segment of the waveguide 302 (i.e. forward of the reflector 303 and extending as far as the forward end of the grating 305), the optical reflector 303, and the optical grating 305 therefore define a distributed feedback (DFB) laser resonator (partial-grating DFB lasers in FIGS. 12C and 12D; a full-grating DFB laser in FIG. 12E). That portion of the forward-propagating optical signal that is not diffracted by the grating 305 continues to propagate in the forward direction as the optical output 399 of the laser resonator.

In the examples of FIGS. 12A-12E, a laser electrode 311 is positioned over at least a portion, of length $L_1$, of the resonator segment of the waveguide 302. The laser electrode 311 is arranged so as to enable a substantially constant laser current $I_1$ to flow through the laser electrode 311 into the resonator segment of the waveguide 302 and produce optical gain therein, thereby producing the laser optical output 399. The electrode 314 on the bottom of the substrate 301 is employed to complete the conduction path for the laser current $I_1$. In the examples of FIGS. 12B and 12D, the laser source includes a second laser electrode 312 positioned over at least a portion, of length $L_2$, of the resonator segment of the waveguide 302. The second laser electrode 312 is arranged so as to enable a substantially constant laser current $I_2$ to flow through the second laser electrode 312 into the resonator segment of the waveguide 302 and produce optical gain therein. In some examples, a current density $I_1/L_1$ differs from a current density $I_2/L_2$. In some examples, such differing current densities can be adjusted in various ways to yield one or more desirable performance characteristics of the laser source 300 (described further below).

During operation of the laser source 300, the current $I_1$ (and the current $I_2$, if present) is sufficiently large so that the optical gain it produces exceeds the lasing threshold of the resonator defined by the waveguide 302, the reflector 303, and the reflector 304 or grating 305, resulting in laser output 399. The modulated laser source 300 further comprises an optical modulator 400 optically coupled to the laser resonator. The modulator 400 receives at least a portion of the laser output 399, and modulates the laser output 399, in response to a time-varying primary modulation signal 433 applied to the optical modulator, to produce a modulated output optical signal 499. Although often referred as being provided by an "RF source" 423 (and in many typical examples including frequencies between, e.g., about 50 MHz and about 1.2 GHz in the RF region), the primary modulation signal 433 can include any suitable, desirable, or necessary frequency components in any frequency range. The time-varying primary modulation signal 433 typically encodes information to be transmitted. The application to the modulator 400 of the time-varying primary modulation signal 433 modulates the laser output 399 to produce a modulated output optical signal 499 that thereby encodes the information encoded by the primary modulation signal 433.

The modulator 400 can be of any suitable type (e.g., electro-optic, electro-absorption, optical amplifier, optical attenuator, acousto-optic, and so forth) formed in any suitable medium (e.g., bulk semiconductor or dielectric, semiconductor or dielectric waveguide, optical fiber, and so forth). The details of the operation of various conventional types of external modulator 400 need not be repeated here. The laser output 399 can be coupled to the modulator 400 in any suitable way, e.g., by free-space optical propagation that may include one or more optical elements, by propagation through an intervening optical fiber or waveguide, by butt-coupling of the waveguide 302 and the modulator 400, by integration of the laser resonator and modulator 400 as distinct portions of a common waveguide on a common substrate (e.g., as in the example of FIG. 13), or by other suitable arrangements.

Typically, a benefit of using the external modulator 400 is an improvement in one or more of frequency chirp (reduced), carrier-to-noise ratio (CNR; increased), or one or more other operational parameters that characterize the modulated output optical signal 499, relative to the output of, e.g., a directly modulated laser source. It has been observed that the modulated output optical signal 499 can still exhibit an operationally significant level of chirp, and that further reduction of that chirp can be advantageous (e.g., to achieve a higher CNR). The chirp can arise in a number of ways (not all of which have been identified or characterized). One commonly recognized mechanism is optical feedback of a small portion of the modulated output optical signal 499 into the laser resonator, e.g., by unwanted backscatter or back-reflection. However, the chirp exhibited by a set of nominally identical laser sources varies from one device to the next in a somewhat random way, with the set being characterized by a mean value and variance of the chirp. For example, the chirp arising from optical feedback varies according to uncertainties in the phase of the feedback signal (e.g., due to variances in the spacing between separate components or in the relative positions of gratings or end faces formed on a substrate). In another example, leakage of a small fraction of a modulation current from a modulator portion to a laser portion of an integrated semiconductor device has been proposed as another mechanism for causing unwanted chirp.

For purposes of the present disclosure and appended claims, chirp can be characterized as "red-shifted" (in which the laser wavelength increases with increasing laser power) or "blue-shifted" (in which the laser wavelength decreases with increasing laser power). Depending on the details of the fabrication and arrangement of a set of nominally identical laser sources 300, the laser sources 300 of the set can exhibit a mean chirp that is red-shifted, blue-shifted, or nearly zero. For a given mean chirp for a set of laser sources, individual devices within that set can exhibit chirp that is greater than or less than the mean, and in some instances (if the chirp variance is sufficiently large) can exhibit red-shifted chirp even if the mean chirp of the set is blue-shifted, or blue-shifted chirp even if the mean chirp for the set is red-shifted. It would be desirable to provide a modulated laser source in which red- or blue-shifted chirp can be at least partly compensated, so as to reduce the overall chirp, increase the CNR, or otherwise improve one or more operational parameters of the modulated output optical signal. It would be further desirable if that compensation were adjustable or selectable for each individual laser source 300, so as to enable tailored compensation of the chirp for each individual device of a set of laser sources 300.

To enable such compensation, in the examples of FIGS. 12A, 12C, and 12E in which a single laser electrode 311 is employed, a laser-electrode electrical circuit 321 is coupled to the laser electrode 311. The laser-electrode electrical circuit 321 is arranged so as to derive from the primary modulation signal 433 a time-varying laser-electrode secondary modulation current 331. The laser-electrode secondary modulation current 331 flows through the laser electrode 311 into or out of the resonator segment of the waveguide 302, in addition to the laser current $I_1$ that flows into the resonator segment of the waveguide 302. In the examples of FIGS. 12B and 12D, in which first and second laser electrodes 311 and 312 are employed, one or both of first or second laser-electrode electrical circuits 321 or 322 can be employed, coupled to first or second laser electrodes 311 or 322, respectively. The first laser-electrode electrical circuit 321 (if present) is arranged so as to derive from the primary modulation signal 433 the time-varying first laser-electrode secondary modulation current 331. The first laser-electrode secondary modulation current 331 flows through the first laser electrode 311 into or out of the resonator segment of the waveguide 302, in addition to the laser current $I_1$ that flows into the resonator segment of the waveguide 302. The second laser-electrode electrical circuit 322 (if present) is arranged so as to derive from the primary modulation signal 433 a time-varying second laser-electrode secondary modulation current 332. The second laser-electrode secondary modulation current 332 flows through the second laser electrode 312 into or out of the resonator segment of the waveguide 302, in addition to the laser current $I_2$ that flows into the resonator segment of the waveguide 302. In some examples, an inventive laser source 300 that include two electrodes 311 and 312 also includes both first- and second-laser-electrode electrical circuits 321 and 322; in other examples, an inventive laser source 300 that include two electrodes 311 and 312 also includes only one or the other of the first- or second-laser-electrode electrical circuits 321 or 322. The nature, magnitude, and variance of the observed chirp of a set of laser devices (e.g., blue-shifted or red-shifted) can guide the selection of which one, or both, of the circuits 321 or 222 can or should be advantageously employed to reduce chirp of the laser sources.

In many examples, each of the electrical circuits 321 or 322 is arranged so that the corresponding first- or second-laser-electrode secondary modulation current 331 or 332 is derived from the primary modulation signal 433 by corresponding scaling, phase-shifting, or filtering of a corresponding portion of the primary modulation signal 433. Generally in such examples, up to four adjustable parameters can be made available for compensating the chirp of a given laser source, i.e., amplitude and phase (relative to the primary modulation current 433) of each of the two secondary modulation currents 331 and 332. More typically, it is not necessary to provide all four of those adjustable or selectable parameters to provide a useful or acceptable level of chirp compensation. In many examples only one secondary modulation current 331 or 332 can be employed to provide sufficient chirp compensation, with a fixed phase (typically either substantially in-phase or inverted) and an adjustable or selectable amplitude. In one specific example, a scaled, in-phase replica of the primary modulation signal 433 is applied to the first laser electrode 311 as the secondary modulation current 331, with no circuit 322 or modulation current 332. In another specific example, a scaled, inverted replica of the primary modulation signal 433 is applied to the second laser electrode 312 as the secondary modulation current 332, with no circuit 321 or current 331. Other schemes employing differing combinations of one or both circuits 321 or 322 producing one or both secondary modulation currents 331 or 332, with differing combinations of one or more adjustable or selectable circuit parameters (e.g., relative amplitude or phase), can be advantageously employed within the scope of the present disclosure or appended claims.

The following discussion refers to the laser-electrode electrical circuit 321 (if present) and the laser-electrode secondary modulation current 331 (if employed), but can apply equally to the second laser-electrode electrical circuit 322 (if present) and the second laser-electrode secondary modulation current 332 (if employed), or to both circuits/currents if both are present/employed (independently, i.e., the circuits 321 and 322 can be, but need not be, arranged in a generally similar way). The electrical circuit 321 is coupled to the laser electrode 311, and is arranged so as to derive from the primary modulation signal 433 the secondary modulation current 331 that flows into or out of the laser electrode 311. The circuit 321 can include any suitable arrangement of one or more active or passive electrical circuit elements. Some simple examples can include, e.g., only a single resistor or capacitor in series between the laser electrode 311 and the source 423 of the primary modulation signal 433, or a voltage divider with the secondary modulation current 331 flowing from between the elements of the divider. Another example can include a p-i-n diode in series between the electrode 311 and source 423, with an RF resistance that varies with a DC control current 213. Other more complex circuit arrangements can be employed, and can include one or more resistors, capacitors, inductors, potentiometers, diodes, transistors, amplifiers, attenuators, filters, digital potentiometers, digital-to-analog converters (DACs), varactor diodes, digital microcontrollers, and so forth, in any suitable, desirable, or necessary arrangement.

In some examples, one or more elements of the circuit 321 can be selected from a set of elements having differing, discrete values (e.g., a set of resistors of differing, discrete resistance values, or a set of capacitors of differing, discrete capacitance values). Such selectable circuit elements (whatever their type) can be implemented in any suitable way, such as by installing only the selected element in the circuit 321, by selective placement of a jumper or connector or formation of a connection to one of a set of multiple different circuit elements all pre-installed in the circuit, or by selective destruction of connections to all but the selected one of a set of multiple different pre-installed circuit elements. In other examples, a substantially continuous or quasi-continuous range of values (e.g., resistance or capacitance) can be provided, such as by using a potentiometer or variable capacitor, by using a DAC to apply a variable control current to a p-i-n diode to alter its effective RF resistance, or by application of a control voltage to an active component such as an amplifier or variable attenuator.

Any circuit 321 (and the corresponding secondary modulation current 331 it produces) that results in improvement of one or more operational parameters of the output optical signal 499 (e.g., reduced chirp, increased CNR, and so forth) shall fall within the scope of the present disclosure or appended claims, even if not fully optimized. "Improved" in the context of the present disclosure and appended claims means improved with respect to a hypothetical laser source that lacks both circuits 321 and 322, but is otherwise identical to the inventive laser source 300 and operated with the same current $I_1$ (and $I_2$, if present), and the same primary modulation signal 433. It is typically desirable to optimize one or more parameters of the output optical signal 499 with respect to the adjustable or selectable circuit parameters that are available, which may or may not result in absolute optimization of those optical signal parameters.

For example, if a set of circuit elements having differing, discrete values is employed, the absolute optimum value for that circuit element might fall between two available discrete values; it is nevertheless advantageous to select the discrete value that results in the best available optical signal parameter, and for purposes of the present disclosure and appended claims, the optical signal parameter in such an example is considered optimized with respect to that particular set of selectable circuit elements. In another example, if a continuous or quasi-continuous range of an adjustable circuit parameter is available, more accurate optimization with respect to that adjustable parameter can be achieved. In other examples, if alteration of a circuit parameter would result in an improved optical signal parameter but is not available for selection or adjustment, the optical signal parameter can still be improved or optimized by selection or adjustment of those circuit parameters that are available (e.g., an optical signal parameter can be improved or optimized with respect to a selectable or adjustable amplitude of the secondary modulation current, even if further improvement could have been achieved by a phase adjustment that is not available; that signal would be considered optimized with respect to selection or adjustment of the amplitude).

In a latter manufacturing stage of a set of laser sources 300, each laser source 300 of the set can be operated while connected to test equipment (typically including coupling the output signal 499 through an optical fiber to a photodetector or spectrum analyzer or other test equipment). The connected laser source 300 can be operated while altering the circuit 321 (e.g., by inserting selectable circuit elements of differing values, or by adjusting an adjustable circuit element or control input) and monitoring one or more of its performance parameters (e.g., chirp or CNR). One or more selected or adjusted circuit elements are incorporated into the circuit 321 that results in improvement or optimization of the one or more of the monitored optical signal parameters for the finished laser source 300. That process is repeated for each laser source 300 of the set to improve or optimize the optical signal parameters for each corresponding laser. Due to the variance of the chirp from device to device, the selection or adjustment of the one or more circuit elements will also vary from device to device.

Figure 13:
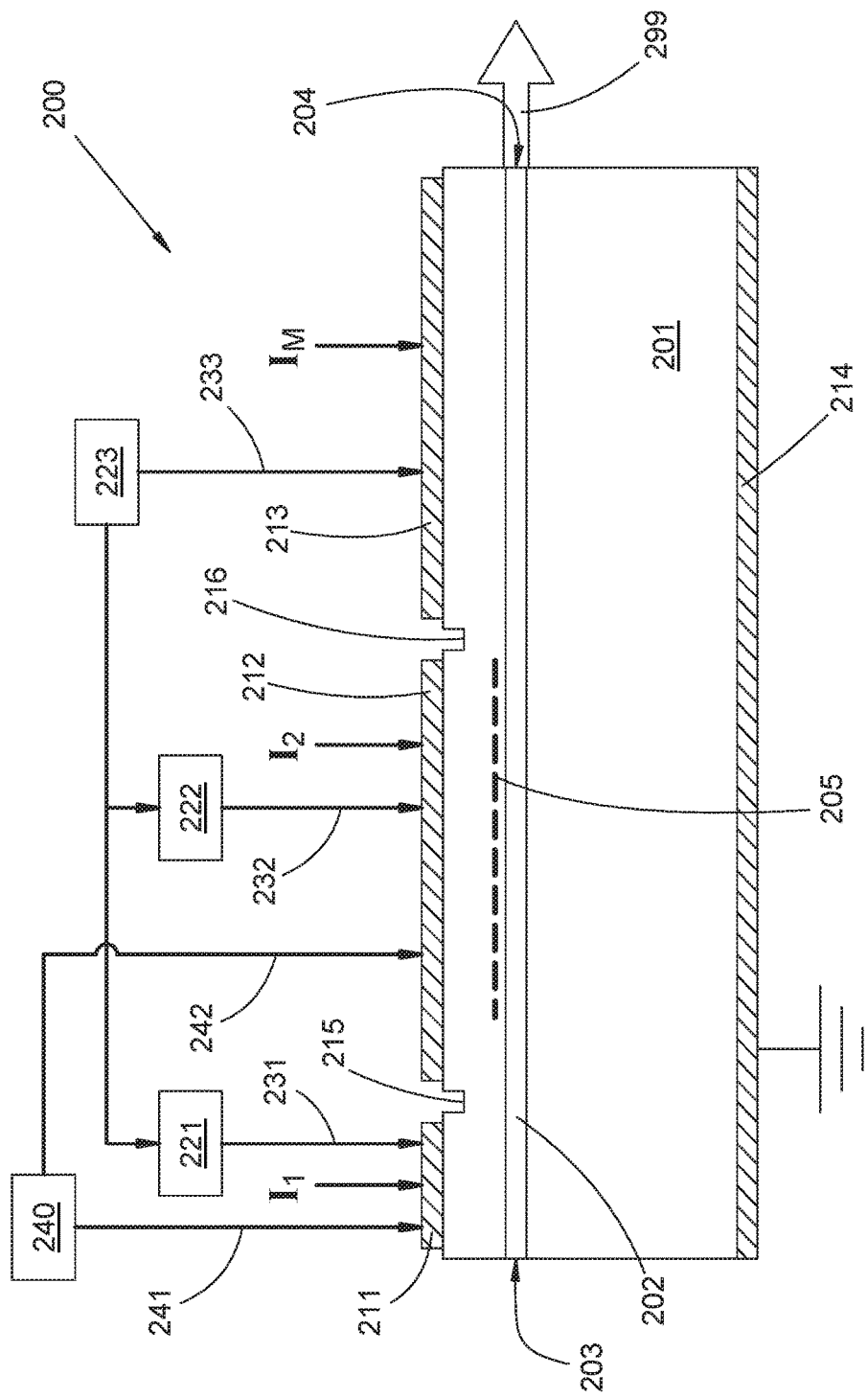

Another example embodiment of an inventive modulated semiconductor laser source 200 is illustrated schematically in FIG. 13 and is arranged as a partial-grating distributed feedback (DFB) laser with an external modulator formed on a common substrate 201. The example of FIG. 13 comprises an optical waveguide 202 formed on the semiconductor substrate 201. The waveguide 202 can be of any suitable type or arrangement (e.g., including those described above), the substrate 201 and the waveguide 202 can comprise any suitable semiconductor materials (e.g., including those described above), and the waveguide can operate over any suitable operating wavelength range (e.g., including those described above).

One end face (rear) of the substrate 201 and the waveguide 202 is arranged as a reflective surface, and can be formed in any suitable way (e.g., cleaving, cutting, etching, polishing, and so forth). The reflective surface exhibits relatively high optical reflectivity and acts as an optical reflector 203 (as described above; e.g., by Fresnel reflection or with a suitable optical coating). Other suitable reflector types can be employed, including those not necessarily formed on the end face of the substrate 201 or waveguide 202 (e.g., a distributed Bragg reflector). An optical grating 205 is formed or arranged on the substrate 201 or the waveguide 202 in any suitable way (e.g., including those described above) to act as a second optical reflector. The waveguide 202, the optical reflector 203, and the optical grating 205 define a partial-grating DFB laser resonator. That portion of the forward-propagating optical signal that is not diffracted by the grating 205 continues to propagate in the forward direction along the waveguide 202 as the optical output of the laser resonator. That portion of the optical output of the laser that reaches the second (front) end face 204 of the substrate 201 and waveguide 202 is transmitted as a modulated output optical signal 299 of the laser source 200. The front end face 204 can be formed in any suitable way, including those used to form the rear end face, and can include an anti-reflection coating of any suitable type, if needed or desired. In many examples, an optical fiber is coupled to the laser source 200 in any suitable way to receive at least a portion of the modulated output optical signal 299 to propagate along the optical fiber.

A first laser electrode 211 is positioned over a first segment of the waveguide 202 between the reflector 203 and the grating 205; the length of the first waveguide segment is $L_1$. A substantially constant first laser current $I_1$ flows through the first laser electrode 211 into the first segment of the waveguide 202. The current $I_1$ produces optical gain in the first segment of the of the waveguide 202. Similarly, a second laser electrode 212 is positioned over a second segment of the waveguide 202 that includes the grating 205; the length of the second waveguide segment is $L_2$. A substantially constant second laser current $I_2$ flows through the second laser electrode 212 into the second segment of the waveguide 202. The current $I_2$ produces optical gain in the second segment of the of the waveguide 202. During operation of the laser source 200, the currents $I_1$ and $I_2$ are sufficiently large so that the optical gain they produce exceeds the lasing threshold of the resonator defined by the waveguide 202, the reflector 203, and the grating 205, resulting in laser output from the resonator that propagates forward from the grating 205 along the waveguide 202. A vertical gap 215 formed in the semiconductor material between the electrodes 211 and 212 can be employed to electrically separate those electrodes. An electrode 214 on the bottom of the substrate 201 is employed to complete the conduction path for the first and second laser currents $I_1$ and $I_2$ to flow.

A modulator electrode 213 is positioned over a third segment of the waveguide 202 forward of the grating 205. A superposition of a substantially constant modulator current $I_M$ and at least a portion of a time-varying primary modulation current 233 flow through the modulator electrode 213 into or out of the third segment of the waveguide 202. In some examples, the current $I_M$ is about zero. In some examples, the laser source 200 is operated with currents $I_2$ and $I_M$ that result in a positive voltage on the second laser electrode 212 that is larger than a positive voltage on the modulator electrode 213. Although indicated as being provided by an "RF source" 223 in FIG. 13 (and in many typical examples including frequencies between, e.g., about 50 MHz and about 1.2 GHz in the RF region), the primary modulation current 233 can include any suitable, desirable, or necessary frequency components in any frequency range. The time-varying primary modulation current 233 typically encodes information to the transmitted. The superposition of the current $I_M$ and the time-varying primary modulation current 233 produce time-varying optical gain or loss in the third segment of the waveguide 202, thereby modulating the laser output to produce a modulated output optical signal 299 that thereby encodes the information encoded by the primary modulation current 233. The details of the operation of the external modulator thus provided are disclosed in the various incorporated references listed in the background and are discussed further below. A vertical gap 216 formed in the semiconductor material between the electrodes 212 and 213 can be employed to electrically separate those electrodes. The electrode 214 on the bottom of the substrate 201 is employed to complete the conduction path for the modulator current $I_M$ and the primary modulation current 233 to flow.

As already noted above, one benefit of use of the external modulator described thus far (and in the references incorporated above) is an improvement in one or more of frequency chirp (reduced), carrier-to-noise ratio (CNR; increased), or one or more other operational parameters that characterize the modulated output optical signal 299, relative to the output of, e.g., directly modulated laser sources. Also as already noted above, it has been observed that the modulated output optical signal 299, with the laser source operated as described in the incorporated references, can still exhibit an operationally significant level of chirp, and that further reduction of that chirp can be advantageous (e.g., to achieve a higher CNR). It would be desirable to provide a modulated laser source 200 in which red- or blue-shifted chirp can be at least partly compensated, so as to reduce the overall chirp, increase the CNR, or otherwise improve one or more operational parameters of the modulated output optical signal. It would be further desirable if that compensation were adjustable or selectable for each individual laser source 200, so as to enable tailored compensation of the chirp for each individual device of a set of laser sources 200.

To enable such compensation of chirp exhibited by the example inventive modulated laser source 200 of FIG. 13, the laser source 200 further comprises one or both of a first-laser-electrode electrical circuit 221 or a second-laser-electrode electrical circuit 222. The first-laser-electrode electrical circuit 221 (if present) couples the first laser electrode 221 and the modulator electrode 213. The first-laser-electrode electrical circuit 221 derives from the primary modulation current 233 a time-varying first-laser-electrode secondary modulation current 231, and enables the first-laser-electrode secondary modulation current 231 to flow through the first laser electrode 211, into or out of the first segment of the waveguide 202, in addition to the first laser current $I_1$ that flows into the first segment of the waveguide 202. The second-laser-electrode electrical circuit 222 (if present) couples the second laser electrode 212 and the modulator electrode 213. The second-laser-electrode electrical circuit 222 derives from the primary modulation current 233 a time-varying second-laser-electrode secondary modulation current 232, and enables the second-laser-electrode secondary modulation current 232 to flow through the second laser electrode 212, into or out of the second segment of the waveguide 202, in addition to the second laser current $I_2$ that flows into the second segment of the waveguide 202. In some examples the inventive laser source 200 includes both first- and second-laser-electrode electrical circuits 221 and 222; in other examples the inventive laser source 200 includes only one or the other of the first- or second-laser-electrode electrical circuits 221 or 222. The nature, magnitude, and variance of the observed chirp of a set of laser devices (e.g., blue-shifted or red-shifted) can guide the selection of which one, or both, of the circuits 221 or 222 can or should be advantageously employed to reduce chirp of the laser sources.

In many examples, as already described above, each of the electrical circuits 221 or 222 is arranged so that the corresponding first- or second-laser-electrode secondary modulation current 231 or 232 is derived from the primary modulation current 233 by corresponding scaling, phase-shifting, or filtering of a corresponding portion of the primary modulation current 233. Generally in such examples, up to four adjustable parameters can be made available for compensating the chirp of a given laser source, i.e., amplitude and phase (relative to the primary modulation current 233) of each of the two secondary modulation currents 231 and 232. More typically, it is not necessary to provide all four of those adjustable or selectable parameters to provide a useful or acceptable level of chirp compensation. In many examples only one secondary modulation current 231 or 232 can be employed to provide sufficient chirp compensation, with a fixed phase (typically either substantially in-phase or inverted) and an adjustable or selectable amplitude. In one specific example, a scaled, in-phase replica of the primary modulation current 233 is applied to the first laser electrode 211 as the secondary modulation signal 231, with no circuit 222 or modulation current 232. In another specific example, a scaled, inverted replica of the primary modulation current 233 is applied to the second laser electrode 212 as the secondary modulation current 232, with no circuit 221 or current 231. Other schemes employing differing combinations of one or both circuits 221 or 222 producing one or both secondary modulation currents 231 or 232, with differing combinations of one or more adjustable or selectable circuit parameters, can be advantageously employed within the scope of the present disclosure or appended claims.

Adjustment or selection of one or more circuit elements or parameters among multiple laser sources 200, to individually improve or optimize one or more optical signal parameters of the modulated output signal 299 for each laser source 200, can be carried out as described above. Any circuits 221 or 222 or both (and the corresponding secondary modulation signals 231 or 232 or both that are produced) that result in improvement of one or more operational parameters of the output optical signal 299 (e.g., reduced chirp, increased CNR, and so forth) shall fall within the scope of the present disclosure or appended claims, even if not fully optimized. "Improved" in the context of the present disclosure and appended claims means improved with respect to a hypothetical laser source that lacks both circuits 221 and 222, but is otherwise identical to the inventive laser source 200 and operated with the same currents $I_1$, $I_2$, and $I_M$, and the same primary modulation current 233. It is typically desirable to optimize one or more parameters of the output optical signal 299 with respect to the adjustable or selectable circuit parameters that are available, which may or may not result in absolute optimization of those optical signal parameters, as already described above.

In addition to the current $I_1$ (and the secondary modulation current 231, if present) and the current $I_2$ (and the secondary modulation current 232, if present), a wavelength-dithering current source 240 can be arranged to provide a wavelength-dithering current that can flow through one or both of the electrodes 211 and 212. The following discussion of wavelength-dithering current(s) also applies to the examples of FIGS. 12A-12E. One portion 241 (if present) of the wavelength-dithering current can flow through the first laser electrode 211 in addition to the first laser current $I_1$ that flows into the first segment of the waveguide 202 and the secondary modulation current 231 (if present) that flows into or out of the first segment of the waveguide 202. Another portion 242 (if present) of the wavelength-dithering current can flow through the second laser electrode 212 in addition to the second laser current $I_2$ that flows into the second segment of the waveguide 202 and the secondary modulation current 232 (if present) that flows into or out of the second segment of the waveguide 202. The wavelength-dithering current can oscillate at one or more frequencies to impart a corresponding wavelength dither of the output optical signal 299. If the dither amplitude is sufficiently large (empirically determined for a given optical signal level and fiber length), the wavelength dithering broadens the optical spectrum of the optical output signal 299 and thereby reduces, suppresses, or substantially eliminates optical loss in an optical fiber carrying the signal 299 due to stimulated Brillouin scattering (SBS). However, care should be taken that the wavelength dither does not unduly degrade or distort the desired modulation of the optical signal 299 imparted by the primary modulation current 233 or introduce unwanted additional modulation of the output signal 299 to an unacceptable degree.

To that end, in some examples the wavelength-dithering current oscillates only at one or more frequencies that are (i) greater than about two times any information-carrying frequency component of the primary modulation current 233, (ii) less than about one third of any information-carrying frequency component of the primary modulation current 233, or (iii) in both of those frequency ranges. Restricting to those ranges (so that the wavelength-dithering current substantially lacks any frequency component at a frequency that is greater than about one third of, and less than two times, any information-carrying frequency component of the primary modulation current 233) decreases or eliminates the likelihood of any frequency-shifting or frequency-mixing of any wavelength-dithering frequency component into the modulation bandwidth of the information-carrying primary modulation current 233. In some common examples, the information-carrying frequency components of the primary modulation current 233 are between about 50 MHz and about 1.2 GHz. The corresponding wavelength-dithering current can oscillate at (i) one or more frequencies that are less than about, e.g., 15 MHz, 10 MHz, 5 MHz, 1 MHz, 500 kHz, or 100 kHz, or as low as about 10 kHz, or (ii) one or more frequencies that are greater than about, e.g., 2.4 GHz or 2.5 GHz. The wavelength-dithering current in those examples substantially lacks frequency components at frequencies between about 15 MHz and about 2.4 GHz. In some of those examples the wavelength-dithering current includes one or more frequencies greater than about 2.4 GHz and also one or more frequencies less than about 15 MHz.

In some examples, a portion of the wavelength-dithering current that oscillates at one or more high frequencies (i.e., higher than those of the information-carrying frequencies of the primary modulation current 233) typically flows through only one of the laser electrodes 211 or 212 that carries the larger current density $I_1/L_1$ or $I_2/L_2$. In other words, if $I_1/L_1 > I_2/L_2$ then only the portion 241 of the wavelength-dithering current includes the high-frequency component(s), but if $I_1/L_1 < I_2/L_2$, then only the portion 242 of the wavelength-dithering current includes the high-frequency component(s). The laser electrode with the larger current density is employed so as to reduce or eliminate laser intensity fluctuations in the laser output arising from application of the wavelength-dithering current to the laser electrode 211 or 212. However, in an observed subset of devices, the reverse is true, i.e., it is preferable to apply the high-frequency dithering current to the lower-current-density segment of the waveguide; which situation applies typically must be determined empirically during the individual optimization process for each laser source 200. In some examples, a portion of the wavelength-dithering current that oscillates at one or more low frequencies (i.e., lower than those of the information-carrying frequencies of the primary modulation current 233) typically can flow through either or both laser electrodes 211 or 212, regardless of the current densities $I_1/L_1$ and $I_2/L_2$. If the wavelength-dithering current includes both high- and low-frequency components, in some examples the entire wavelength-dithering current can flow through only one of the electrodes 211 or 212; in other examples the high-frequency component(s) can flow through one of the laser electrodes 211/212 while the low-frequency component(s) can flow through the other laser electrode 212/211.

In some examples the laser source 200 is arranged so that $I_1/L_1>I_2/L_2$; in some of those examples $I_1/L_1$ is at least 1.5 times greater than $I2/L_2$, at least 2 times greater than $I2/L_2$, or at least 5 times greater than $I2/L_2$; other suitable relative current densities can be employed. In some examples the laser source 200 is arranged so that $L_2>L_1$; in some of those examples $L_2$ is more than about three times longer than $L_1$, more than about four times longer than $L_1$, more than about five times longer than $L_1$, or more than about 4 to 6 times longer than $L_1$; other suitable relative lengths can be employed.

As described in the references incorporated in the background, the modulated laser source 200 can be advantageously operated in an operating wavelength range that is shorter than an estimated optical gain peak that characterizes the waveguide 202. Any suitable estimate for the gain peak of the waveguide 202 can be employed. In some examples, the estimated gain peak is a peak wavelength of an electroluminescence spectrum of the third segment of the waveguide 202 measured without any laser output and at an input voltage applied to the modulator electrode 213 about equal to an open-circuit voltage produced by transmission of the laser output through the third segment of the waveguide 202. The operating wavelength range can be 10 nm shorter, about 20 nm shorter, about 30 nm shorter, about 40 nm shorter, or about 50 nm shorter than the estimated optical gain peak wavelength, or shorter than the estimated gain peak by another suitable wavelength offset.

Further details of operation of the modulated laser source 200 disclosed in the references incorporated in the background are briefly described below.

FIG. 1 is block diagram of a prior art optical transmission system in which information or "content" such as audio, video, data files, data bases, or other data is transmitted by an optical transmitter over an optical fiber link to a remote receiver, where the information content is reproduced, displayed, performed, executed, or is otherwise utilized. The optical transmitter may be such as represented in U.S. Pat. No. 5,699,179 utilizing an external modulator. The transmitter, shown generally at 10, transmits an optical signal to a remote receiver 30 over an optical fiber path 20. The transmitter 10 includes a semiconductor laser 11, which produces a continuous wave (CW) output. Typical examples of such lasers are distributed feedback (DFB) lasers or Fabry-Perot lasers that produce an output optical beam at a wavelength of, e.g., 1550 nm. The un-modulated optical signal from the laser is coupled to a modulator 13 by optical fiber 12. The modulator 13 may be a single modulator such as a Mach-Zehnder modulator, a cascaded MZ modulator, or more than one modulator such as in a feed-forward linearizer.

The information- or content-containing signal 14, such as audio, video, or data, is initially converted into (typically) a radio-frequency (RF) signal in a suitable channel or frequency band for transmission, such as an amplitude modulated vestigial sideband (AM-SDB) cable television (CATV) or video signal, or a digital signal such as a quadrature amplitude modulated (QAM) symbols which represents the data in digital format; any suitable modulation scheme can be employed. The RF signal 15 is applied to the modulator 13 via a terminal or electrode on its surface. An electrical bias 16 is also applied to the modulator 13.

The modulated optical signal which carries the information may, in some embodiments, be coupled to an amplifier 17, which in turn is coupled to the a fiber link 20. In some typical examples the amplifier 17 is an erbium doped fiber amplifier (EDFA); other suitable amplifiers can be employed. The amplified optical signal is transmitted over the fiber optical transmission link 20 to the receiver 30. The optical fiber transmission link 20 can in some instances be a long-distance link extending up to 100 km. In this case, line amplifiers such as EDFA 17 can be provided at spaced intervals along in the line in order to boost the signal to desired levels. At the receiver 30, an amplifier (not shown) can be provided to boost the incoming optical signal. The boosted signal is then applied to a photodetector and demodulated at the receiver 30 to an RF electrical signal 31, which can be employed to reproduce at the remote location the information that was originally encoded.

Figure 2:
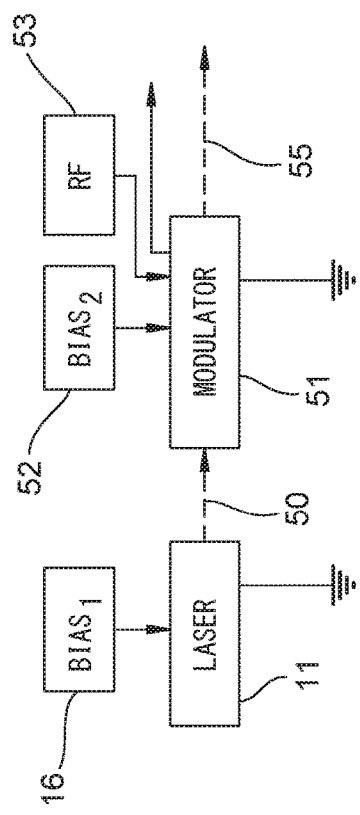
FIG. 2 is an example of an external modulator coupled to a laser according to one or more of the incorporated references.

FIG. 2 shows an example of an optical transmitter including an external modulator coupled to a laser according to one or more of the incorporated references. There is depicted a semiconductor laser 11, which produces a continuous wave (CW) output. The laser 11 is operated at an electrical bias which is denoted as Bias (1). The un-modulated optical beam from the laser is coupled to an external modulator 51 by optical fiber 50, or by free space propagation. The modulator 51 is configured as a waveguide with electrodes coupled thereto, and operated at an electrical bias which is denoted as Bias (2), which is less than that Bias (1). In some embodiments, Bias (2) may be about 0.8 volts, and Bias (1) may be about 1.2 volts. In some embodiments, Bias (2) may be plus or minus 0.1 volts from the value of the open-source voltage that would have occurred if the modulator were pumped by the source laser while no current is injected or extracted from the electrode coupled to the modulator. In some embodiments, Bias (2) can be about 0.95 volts, in the range of about 0.7 to about 0.9 volts, in the range of about 0.6 to about 1.0 volts, or in the range of 0.85 to 1.05 volts.

The information-containing RF signal 53 is also applied to the electrode of the modulator 51, so that during modulation the electrical bias applied to the modulator remains less than Bias (1). The electrical bias applied to the modulator 51 determines the amount of the cw light beam from the laser 11 that is absorbed by the modulator 51. In this way, the cw light beam entering the modulator is modified or modulated by the RF signal 53. An optical output is provided for transferring the modulated optical beam to an output fiber 55.

Figure 3:
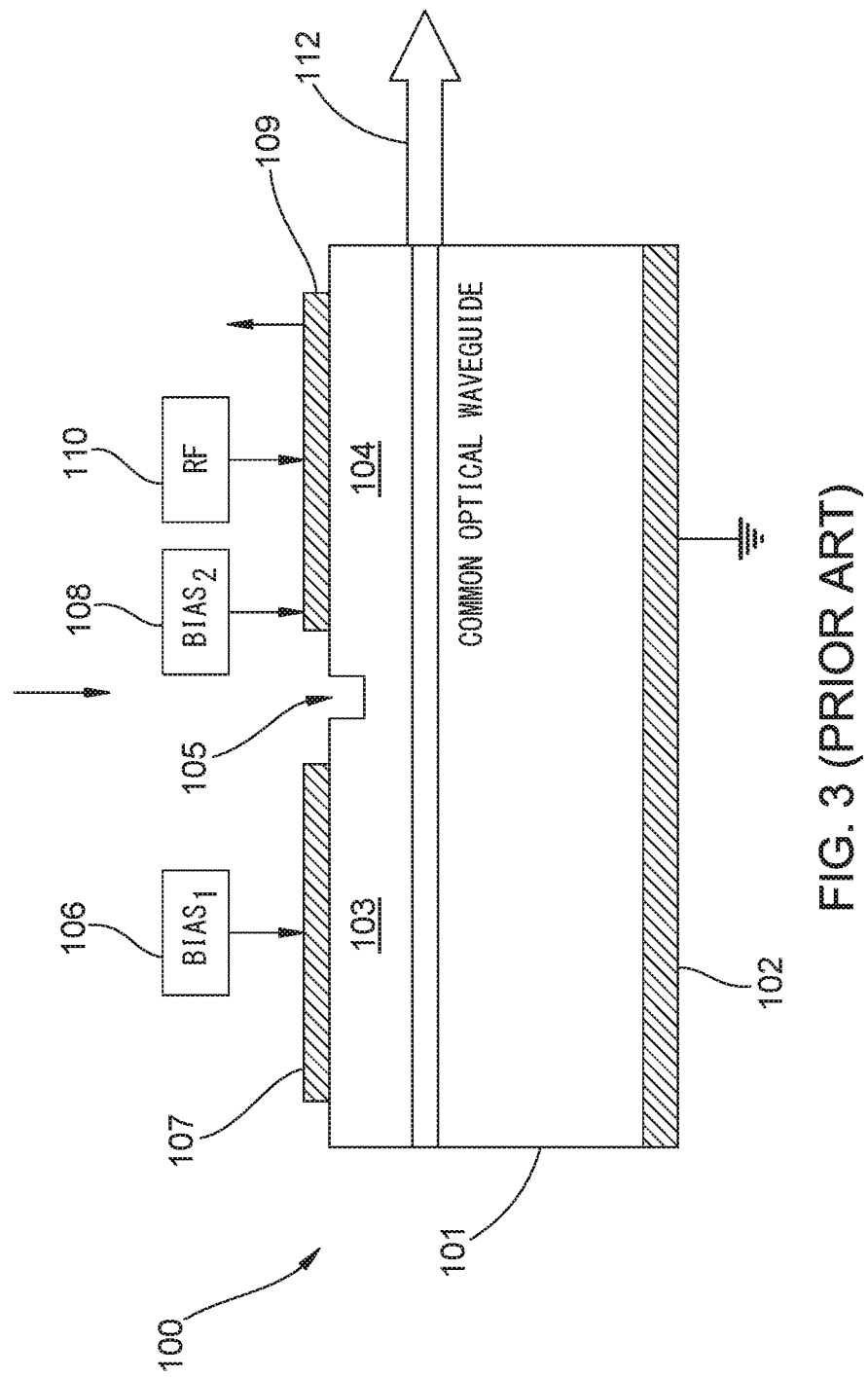
FIG. 3 is another example of an external modulator coupled to a laser according to one or more of the incorporated references.

FIG. 3 shows another example of an external modulator coupled to a laser according to the one or more of the incorporated references. The design and operation of the device of FIG. 3 is similar to that of FIG. 2, except that the laser and the modulator are implemented on a single integral semiconductor device. More particularly, there is depicted a semiconductor device 100 including a first semiconductor region 103 including a laser resonator 100 operable to produce a coherent light output in response to current injection; and a second semiconductor region 104 disposed adjacent to the first semiconductor region. A channel 105 is formed on the surface of the semiconductor device 100 between the regions 103 and 104. The second semiconductor region 104 has an optical input optically coupled thereto for receiving the coherent light output emitted from the first semiconductor region 103, typically by forming a single optical waveguide that spans both regions.

The first semiconductor region 103 is electrically biased by an electrode 107 on the top surface, which is connected to an external electrical bias potential 106 to inject current into the region 103. The second semiconductor region 104 includes a waveguide layer for receiving the light beam from the region 103, an electrode 109 connected (i) to a bias potential 108 for injecting a DC current in the region 104, and (ii) to a radio frequency signal input 110 and waveguide and optically modulating the light beam as the beam traverses the waveguide. The second semiconductor region 104 further includes an optical output 112 connected to the waveguide for transferring the modulated optical signal to an external fiber or other optical component (typically an exit face of the semiconductor substrate). The bias voltage applied to the electrode 109 is appropriately selected so that the coherent light beam in the waveguide is optically modulated by the applied RF signal by modifying or modulating the absorption characteristic in the semiconductor region 104 while the current generated in the waveguide as a result of photoabsorption of the continuous wave coherent light beam is extracted from the semiconductor region 104. The RF and DC currents generated are sunk by the RF source and DC bias respectively.

In some embodiments, the laser region 103 and the modulator region 104 comprise a single chip InP semiconductor device, or other III-V semiconductor single chip device. The laser may comprise an InP semiconductor (or other III-V semiconductor) gain structure region 103 having a mirrored first end region 101 and a second end region disposed adjacent to the modulator (i.e., continuous with the waveguide structure 104). Suitable examples for the gain region 103 and modulator region 104 can include, e.g., InGaAsP or InAlGaAs lattice-matched to an InP substrate, forming multi-quantum wells or optical confinement heterostructures. The first electrode 107 is disposed over the InP semiconductor laser gain region 103, and the second electrode 109 is disposed over the InP semiconductor (or other III-V semiconductor) modulator waveguide region 104, and a ground electrode 102 is provided extending over the bottom surface of the entire semiconductor structure.

In the embodiment in which the laser and the modulator are integrated on a single semiconductor substrate, and a vertical gap extending about 1 micron into the substrate electrically separates the laser electrode 107 and the modulator electrode 109 over the first and second semiconductor regions 103 and 104, respectively.

In other embodiments, the laser and the modulator are implemented on two adjacent discrete semiconductor devices, such as depicted in FIG. 2. In some embodiments, an air gap having a width of less than 1 micron may separate the laser and the modulator devices.

The first semiconductor region 103 is electrically biased by an electrode 107 on the top surface, which is connected to an external electrical bias potential 106. The second semiconductor region 104 is electrically biased at a lower second bias potential than the first semiconductor device 103. The specific biasing of the second semiconductor region 104 and the operating current versus voltage characteristics of the device will be described in greater detail with reference to FIG. 4.

Figure 4:
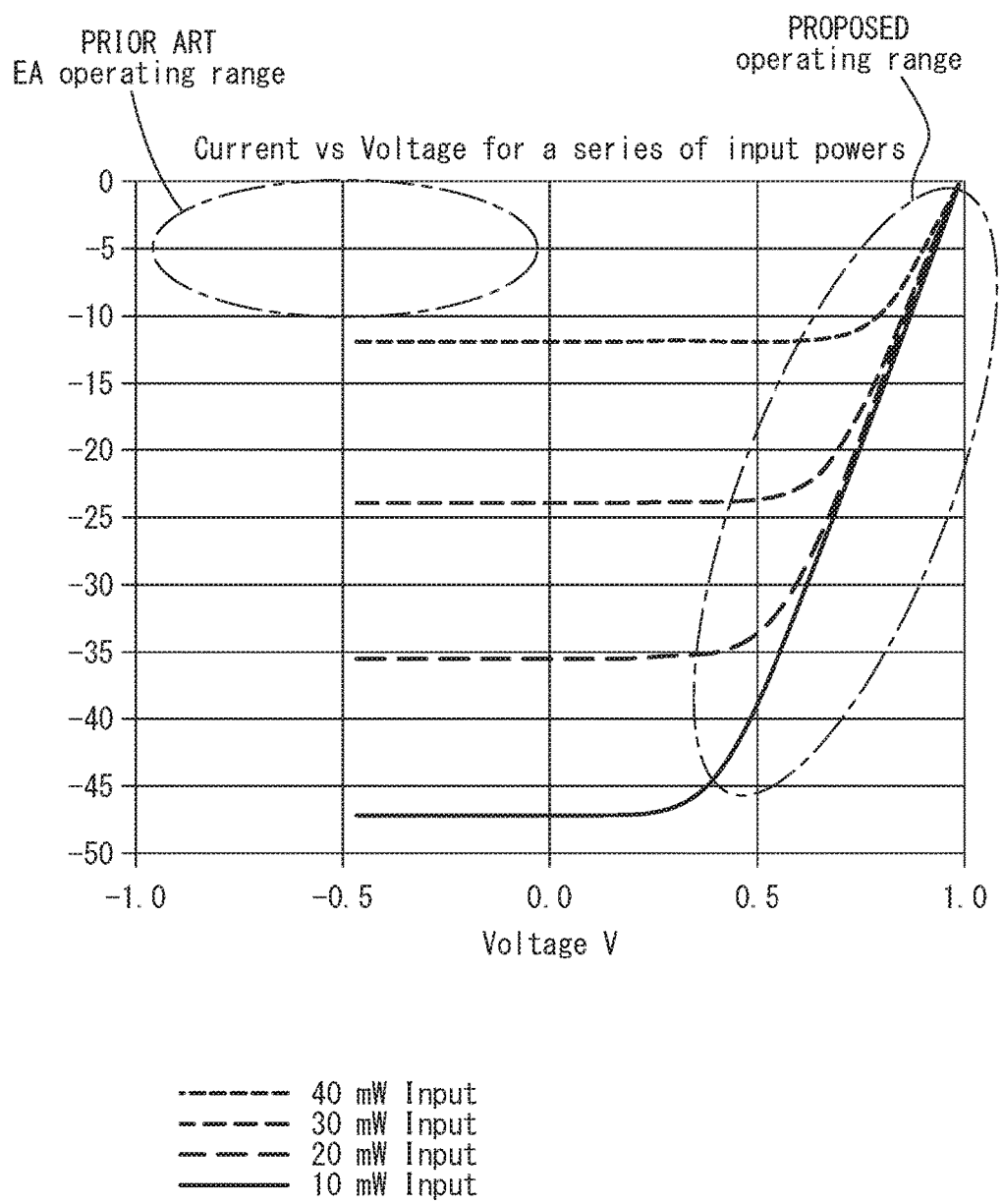
FIG. 4 is a graph of the current versus voltage operating characteristics of a modulator at various input optical powers according to the prior art (region labelled "PRIOR ART EA operating range") and according to the present disclosure and incorporated references (region labelled "PROPOSED Operating range").

FIG. 4 is a graph of the current versus voltage operating characteristics of the semiconductor waveguide region 104 for various input powers (10 mW, 20 mW, 30 mW, and 40 mW) of the cw optical beam. In the prior art, in an electro-absorption modulator, the waveguide region 104 would be biased to operate in a negative voltage, positive current region (as shown by the dashed line region marked "PRIOR ART EA OPERATING RANGE" in FIG. 4). According to the present disclosure and incorporated references, the waveguide region 104 is biased to operate in a positive voltage, higher negative current region (as shown by the dashed line region marked "PROPOSED OPERATING RANGE" in FIG. 4).

In the absence of any applied bias signal, a small amount of the cw optical beam is absorbed in the modulator region 104 and this causes a steady-state carrier density to build up in the modulator region 104. These carriers recombine with a typical lifetime of about one nanosecond. An equilibrium level is reached when the number of carriers generated by optical absorption balances the number lost through recombination. In such an arrangement, the absorption is high when the carrier level is low and the absorption is low and when the carrier density is high. When the bias signal is applied, carriers are extracted from the modulator region 104, which lowers the carrier density, and therefore increases absorption of the modulator. In particular, if a current of −10 mA is extracted from the modulator, then the absorption is increased by an amount required to produce that current of −10 mA. Similarly, if a current of −20 mA is extracted from the modulator, then the absorption is increased by an amount required to produce that current of −20 mA. Another way of describing the operation is that carriers in the semiconductor waveguide region 104 generated by the cw optical beam are excited into a conduction band and are extracted from the semiconductor region 104 by an applied electrical bias field.

Figure 5:
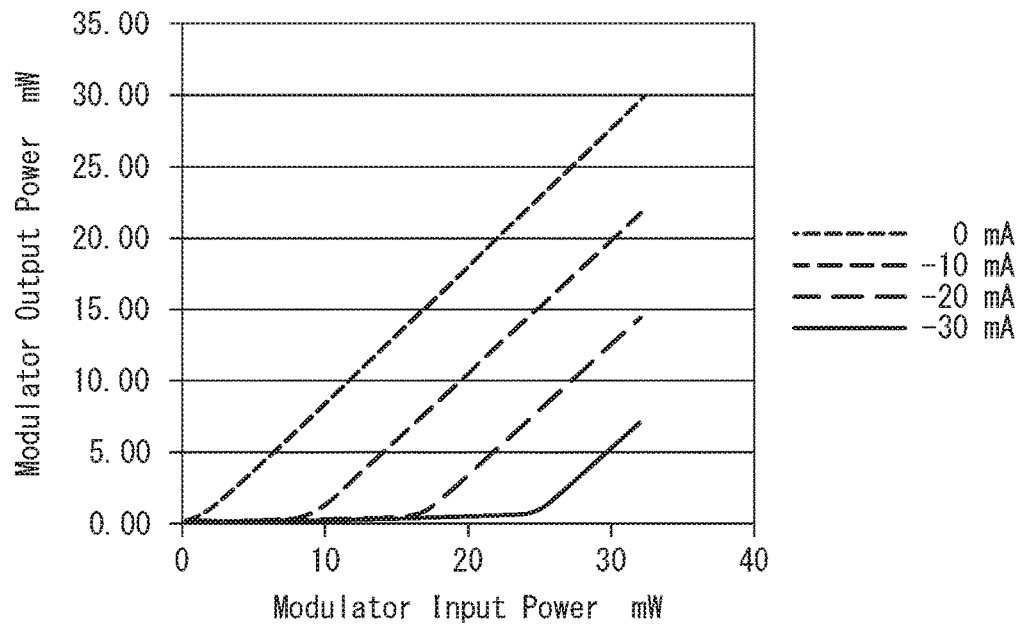
FIG. 5 is a graph depicting the modulator output power versus the modulator input power at various current operation levels according to the present disclosure and incorporated references.

FIG. 5 shows a graph of the output power vs input power for the modulator region 104 according to the present disclosure or incorporated references with the parameter being the current extracted from the modulator region 104. Since the proposed modulator has a low RF impedance, it is possible to modulate it in a manner that is close to a current source modulation (at least down to the point that the output power is close to 0). As can be seen from the FIG. 5, this really modulates the saturation power of the modulator waveguide region 104. When operated at a fixed input power of, for example, 30 mW, the net effect is a modulation of the optical output power. The operation is analogous to an optical power subtraction device in which an amount of light corresponding to the extracted current is absorbed from the input cw optical beam. In effect, after the amount of light corresponding to the extracted current is absorbed, that absorption mechanism is saturated.

Figure 6:
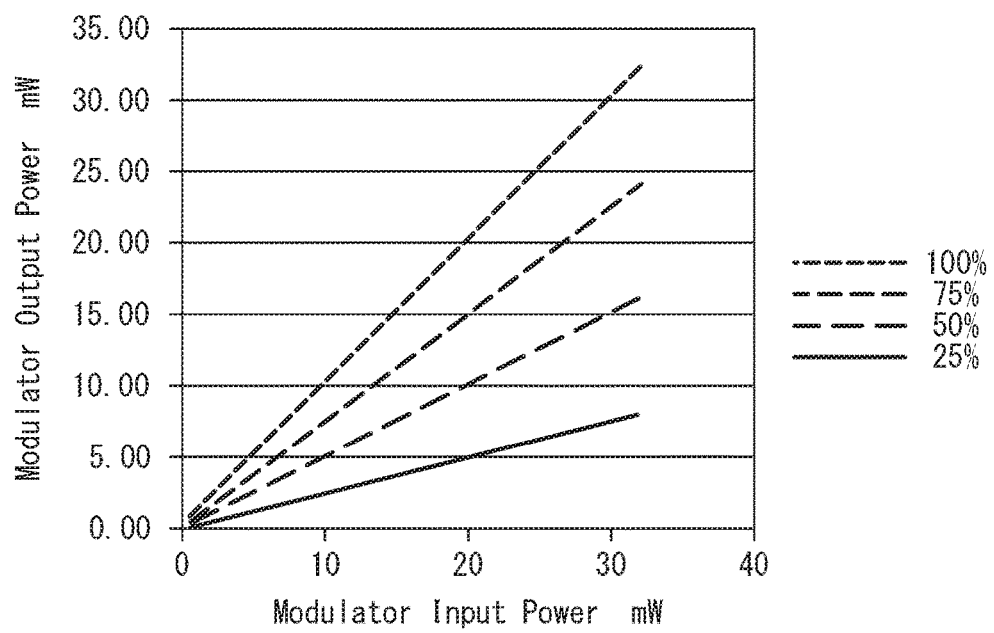
FIG. 6 is a graph depicting the modulator output power versus the modulator input power at various operation levels according to a conventional Mach Zehnder or EA modulator known in the prior art.

The operation of the modulator of FIG. 5 should be contrasted with a traditional modulator where the optical transmission factor is modulated. FIG. 6 shows what happens with a conventional MZ or EA type modulator. The parameter in this FIG. 6 is the transmission through the modulator. For a fixed input power of 30 mW, a modulated output similar to the output of the proposed modulator is produced. However, variation of the output optical power with input optical power with a fixed bias signal is substantially linear, in contrast to the saturation-type variation of the proposed modulator. This reflects the fundamentally different modulation mechanism involved in the proposed modulator.

Figure 7:
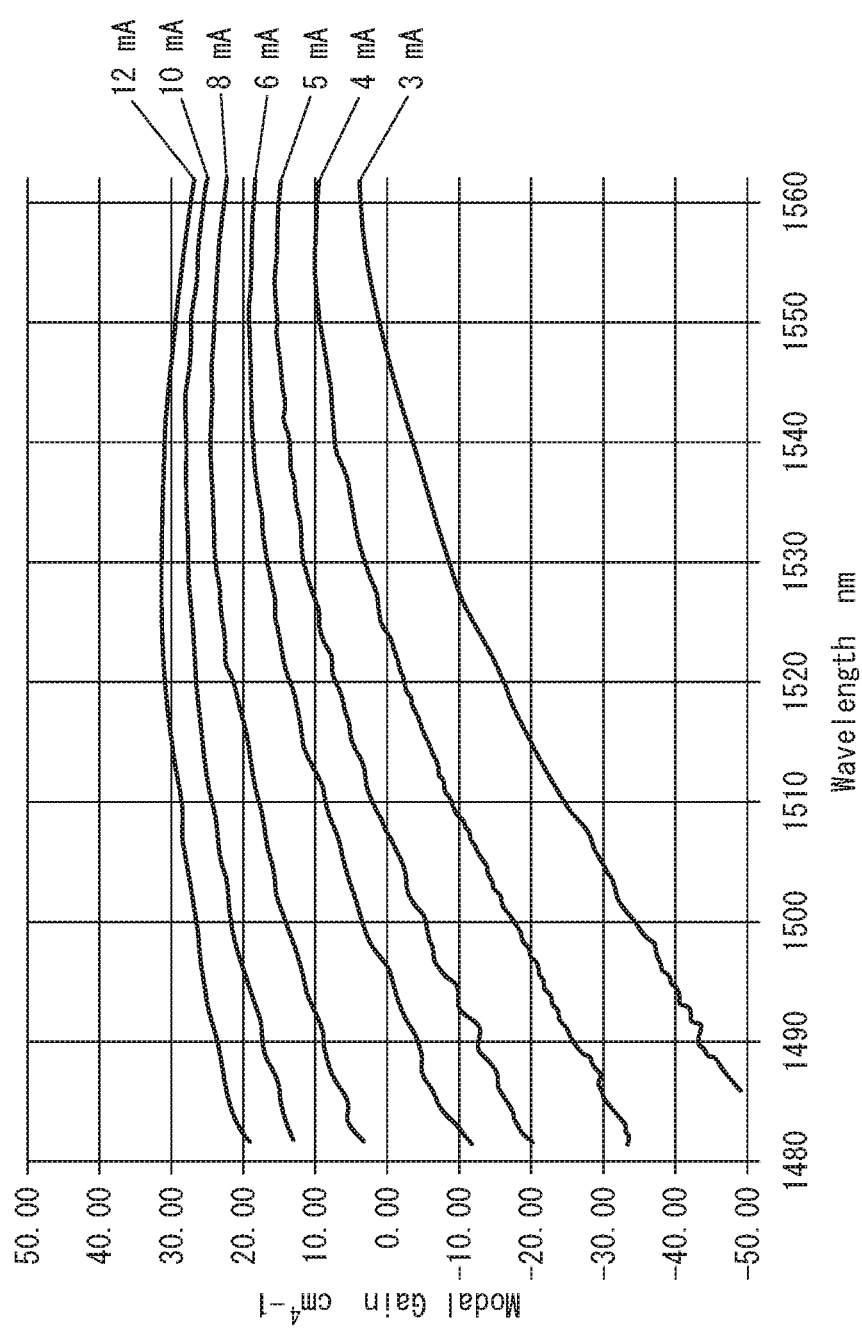
FIG. 7 is a graph depicting the modal gain versus wavelength showing the gain peak wavelength for a given composition of the modulator waveguide according to the present disclosure and incorporated references.
Figure 8:
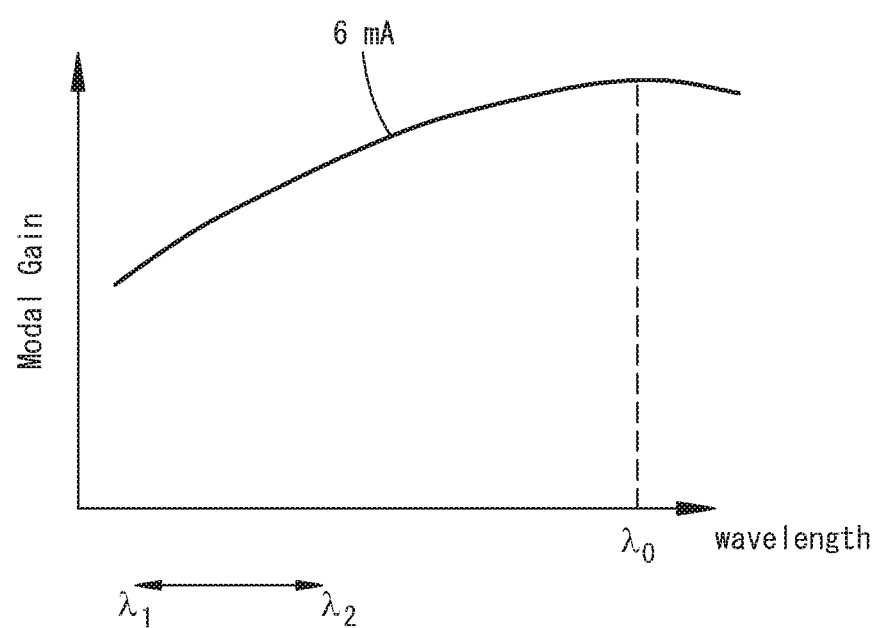
FIG. 8 is a graph depicting the modal gain versus wavelength showing the gain peak wavelength and a range of potential operating wavelengths for the design of a modulator waveguide according to the present disclosure and incorporated references.
Figure 9:
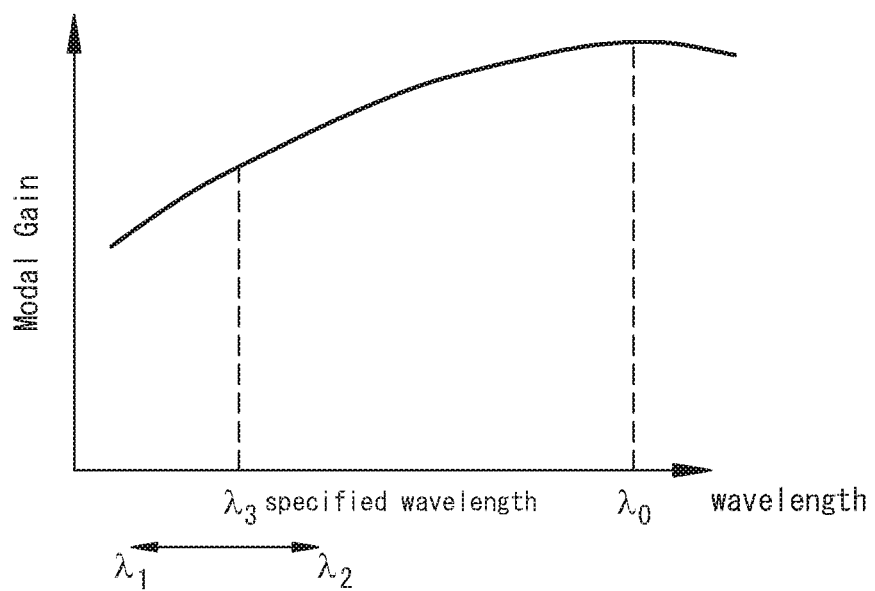
FIG. 9 is a graph depicting the modal gain versus wavelength showing the gain peak wavelength and a selected operating wavelength for a given composition of the modulator waveguide according to the present disclosure and incorporated references.

FIG. 7 is a graph depicting the modal gain versus wavelength showing the gain peak wavelength for a given composition of the modulator waveguide. It is noted that there are different maximum or peak values of the modal gain for different current values through the modulator. FIG. 8 is a graph depicting the modal gain versus wavelength showing the gain peak wavelength and a range of potential operating wavelengths for the design of a modulator waveguide. FIG. 9 is a graph depicting the modal gain versus wavelength showing the gain peak wavelength and a selected operating wavelength for a given composition of the modulator waveguide.

In the proposed device according to the present disclosure, the material in the modulator region 104 is mostly pumped by the light coming from the source laser region 103 that is operating DC. In a test environment, one may evaluate the modulator under the open circuit condition where one is neither injecting nor extracting DC current from the modulator region 104. Under this open circuit condition, the material in the modulator region 104 is pumped to give a carrier density just below the level for which the material becomes optically transparent or has no net absorption or gain. The modulator junction under this condition is at a voltage corresponding to about 0.8 volts forward bias (analogous to the open circuit voltage of a solar cell).

The modulator does not have to be used with the open circuit bias condition. One can either bias the modulator by injecting current, in which case the material will move towards optical gain, or by extracting current, in which case the absorption increases compared to the open circuit bias condition. The current values in the curves graphed in FIG. 7 are merely intended as nominal or representative to depict typical gain peak wavelengths at different current values, since the depicted data is derived from a prototype test structure that is only electrically pumped, unlike the proposed modulator that would be used in actual practice and which would be mostly optically pumped. Although experimentally one cannot directly measure the optical gain curves for the optically pumped case, the data is suggestive and it is believed that the corresponding curves for the optically pumped case move up and to the left for increasing current, similarly to the curves graphed in FIG. 7 for electrically pumped test structures.

The present disclosure and incorporated references do not in all cases specify the signal wavelength relative to the modulator gain curve, since that may depend upon other product design specifications and the user's application environment. However, one aspect of the present disclosure and incorporated references is the fabrication method for the design of an optical modulator and how to specify the wavelength of the material for given operational specifications or requirements. Two methods are reasonable and are embodiments of the present disclosure. One is determining the photoluminescence (PL) peak wavelength. In this case the material is optically pumped and the spectrum of the light emitted from the material is measured by commercially available photoluminescence instruments. This measurement of the photoluminescence (PL) peak wavelength is not the same as measurement of the gain curve, but they are related, and the photoluminescence peak wavelength can be used as an estimated gain peak wavelength. For example the material used for the gain data presented in FIG. 10 has a PL peak wavelength of 1574 nm. A second method would be to specify the peak of the gain curve under some specific pumping condition. No pumping at all is not a good experimental approach for specifying an estimated gain peak since there isn't any gain peak, the absorption just gets steadily larger as the wavelength is reduced. Pumping the modulator until there is a peak in the gain at some specific level is another way to try to specify this, but it is believed to be less well defined than the PL peak. One example of the present disclosure and incorporated references therefore provides making a PL measurement and using the PL wavelength so determined as a method of characterizing the material. In terms of operation, one would want to have the optical signal wavelength (i.e., the operating wavelength of the modulated laser source) be shorter than the PL peak wavelength. That is in contrast to the design and operation of the semiconductor material in an electroabsorption (EA) modulator, wherein the signal wavelength in the EA modulator is typically much larger than the peak PL wavelength. One embodiment of the present disclosure therefore provides the selection or specification of the operating wavelength that one is at least 10 nm below the PL peak. In some embodiments, the selection or specification of the operating wavelength is one that is as much as 30 nm shorter than the PL peak wavelength.

Figure 10:
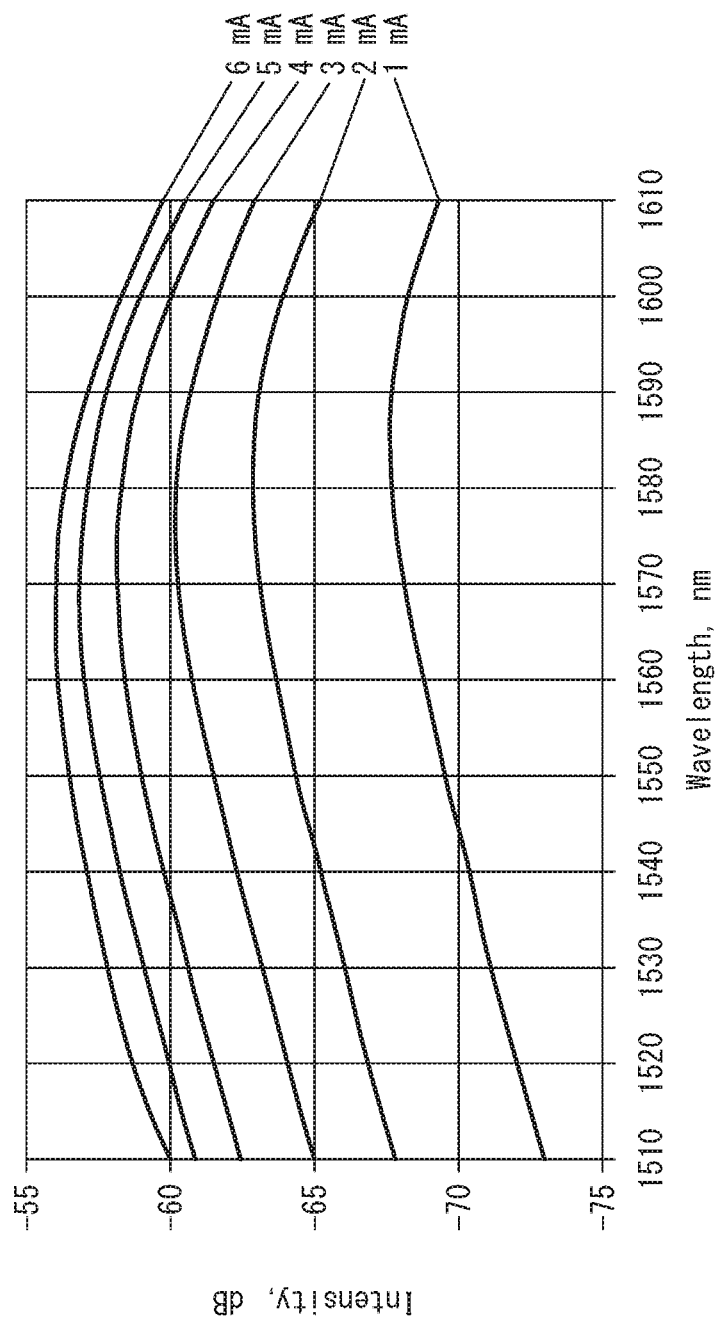
FIG. 10 is a graph depicting the modal gain versus wavelength showing the gain peak wavelength from an electroluminescence measurement of a specimen test modulator at various modulator current values according to the present disclosure and incorporated references.
Figure 11:
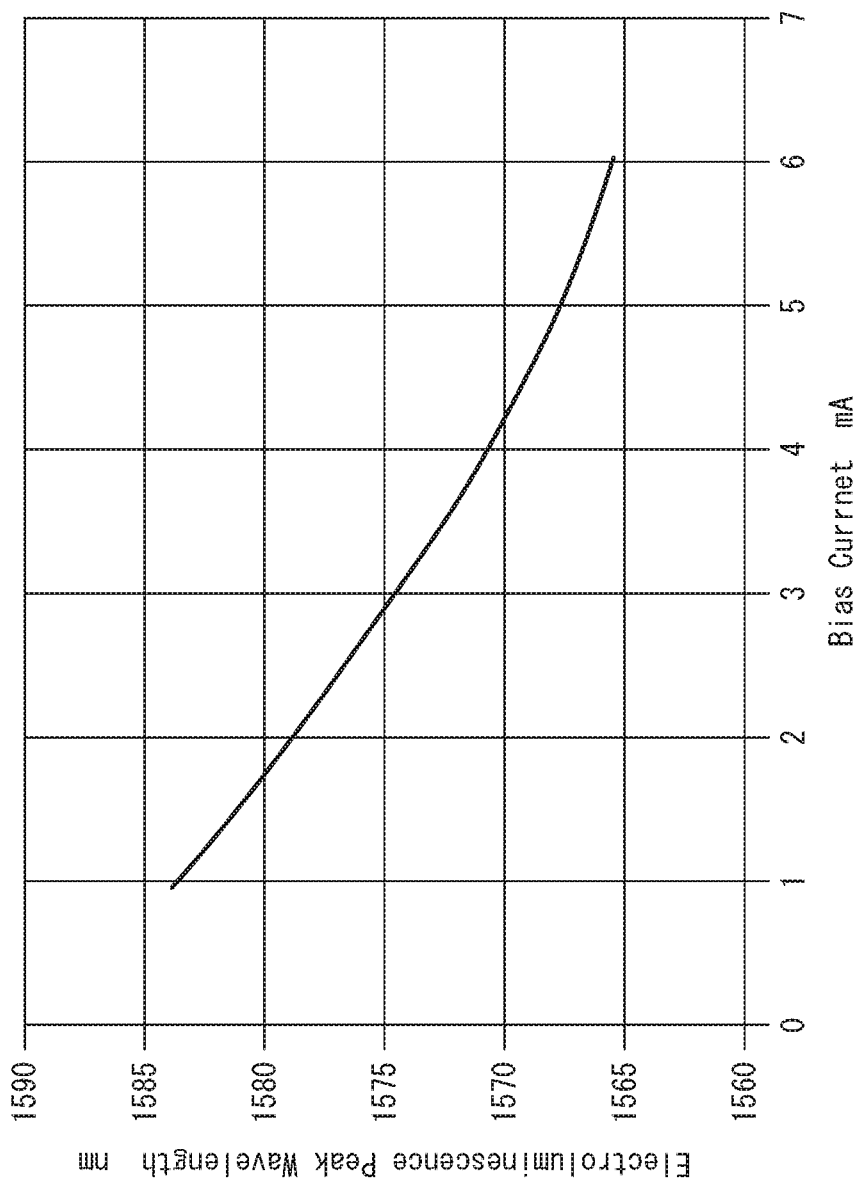
FIG. 11 is a graph depicting the gain peak wavelength versus current from an electroluminescence measurement of a specimen test modulator at various modulator current values according to the present disclosure and incorporated references.

FIG. 10 is a graph depicting the modal gain versus wavelength showing the gain peak wavelength from an electroluminescence (EL) measurement of a specimen test modulator at various modulator current values. In one embodiment of the present disclosure, the peak electroluminescence wavelength extrapolated to zero current can be an appropriate and precise way to estimate the gain peak wavelength of the waveguide material; electroluminescence spectral peak wavelengths measured or determined under other current conditions can be employed to estimate the gain peak wavelength. In this case illustrated in FIG. 10, the peak electroluminescence wavelength is about 1589 nm, which differs from the peak photoluminescence wavelength, which was 1574 nm for the same test wafer. In terms of the operating wavelengths that would use with this material, in one embodiment of the present disclosure, suitable wavelengths would be in the range of about 1520 nm about 1570 nm, or in the range of 1540 to 1550 nm. In another embodiment of the present disclosure, the operating wavelength would be about 10 nm, about 20 nm, about 30 nm, or about 40 nm shorter than the gain peak wavelength estimated by the electroluminescence peak wavelength. FIG. 11 is a graph depicting the gain peak wavelength versus current from an electroluminescence measurement of a specimen test modulator at various modulator current values.

In the course of designing and fabricating the modulated laser source 200, in some examples the semiconductor waveguide material can be characterized to estimate a gain peak, and the grating 205 can be fabricated to produce a laser operating wavelength at a desired wavelength offset from the estimated gain peak. In other examples, a desired operating wavelength can be chosen, a semiconductor waveguide material chosen (or designed and fabricated) that has an estimated gain peak wavelength at the desired wavelength offset from the estimated gain peak, and the grating 205 formed to provide the desired operating wavelength for the laser source 200. In both types of examples, the fabrication process also includes forming the electrodes, forming reflective and transmissive optical surfaces, coupling the electrodes to the corresponding circuits or current sources, and so forth.

In some embodiments, a wavelength-dithering current source 240 is provided that generates a suitable wavelength-dithering current, including one or both of portion 241 applied to laser electrode 211 or portion 242 applied to laser electrode 212, in addition to the currents $I_1$ and $I_2$. As noted above, the impact of SBS in an optical network can be reduced in an externally modulated system if the optical signal's spectrum can be broadened, thereby lowering the energy per unit bandwidth. The wavelength-dithering current is implemented to spread the optical output power over a broadened range of optical wavelengths. In some embodiments, the wavelength-dithering signal includes one or more high-frequency components at one or more frequencies that are more than about two times the highest-frequency component of the RF information-containing primary modulation current 233 (so as to reduce the likelihood or severity of interference with the RF information-containing signal caused by the high-frequency wavelength-dithering current). In some embodiments, the wavelength-dithering signal includes one or more low-frequency components at one or more frequencies that are less than about one third (or less than about one fifth, or less than about one tenth, or even less) of the lowest-frequency component of the RF information-containing primary modulation current 233 (so as to reduce the likelihood or severity of interference with the RF information-containing signal caused by the low-frequency wavelength-dithering current). In some examples, both high- and low-frequency wavelength-dithering signals are applied. In some examples, the high- and low-frequency wavelength-dithering currents can be applied to the same laser electrode 211 or 212; in other examples, the high- and low-frequency wavelength-dithering currents can be applied to different laser electrodes 211 and 212.

In addition to the preceding, the following examples fall within the scope of the present disclosure or appended claims:

Example 1

A modulated semiconductor laser source comprising: (a) an optical waveguide formed on a semiconductor substrate; (b) first and second optical reflectors arranged on the substrate or waveguide so that the first and second reflectors and a resonator segment of the waveguide define a laser resonator arranged so that laser output from the laser resonator is transmitted through the second reflector; (c) a laser electrode positioned over at least a portion, of length $L_1$, of the resonator segment of the waveguide, the laser electrode being arranged so as to enable a substantially constant laser current $I_1$ to flow through the laser electrode into the resonator segment of the waveguide and produce optical gain therein; (d) an optical modulator optically coupled to the laser resonator so as to receive at least a portion of the laser output and to modulate the laser output, in response to a time-varying primary modulation signal applied to the optical modulator, to produce a modulated output optical signal; and (e) a laser-electrode electrical circuit coupled to the laser electrode and arranged so as to derive from the primary modulation signal a time-varying laser-electrode secondary modulation current, and to enable the laser-electrode secondary modulation current to flow through the laser electrode into or out of the resonator segment of the waveguide in addition to the laser current $I_1$ that flows into the resonator segment of the waveguide.

Example 2

The laser source of Example 1 wherein at least one of the first or second reflectors is positioned on an edge facet of the substrate.

Example 3

The laser source of any one of Examples 1 or 2 wherein at least one of the first or second reflectors comprises a distributed Bragg reflector formed in or on the substrate or waveguide.

Example 4

The laser source of any one of Examples 1 through 3 wherein the laser resonator is arranged as a Fabry-Perot laser resonator.

Example 5

The laser source of any one of Examples 1 through 3 wherein the second reflector comprises an optical grating arranged on the substrate or waveguide.

Example 6

The laser source of Example 5 wherein the laser resonator is arranged as a full-grating DFB laser resonator.

Example 7

The laser source of Example 5 wherein the laser resonator is arranged as a partial-grating DFB laser resonator.

Example 8

The laser source of any one of Examples 1 through 7 wherein the optical modulator comprises: (f) a modulator optical waveguide formed on a modulator semiconductor substrate, the modulator waveguide being arranged so as to receive the laser output to propagate along the modulator waveguide; and (g) a modulator electrode positioned over at least a portion of the modulator waveguide, the modulator electrode being arranged so as to alter optical gain or loss of the laser output propagating along the modulator waveguide in response to the primary modulation signal applied to the modulator electrode and thereby modulate the laser output to produce the modulated output optical signal.

Example 9

The laser source of Example 8 wherein the laser and modulator substrates are separate, discrete substrates.

Example 10

The laser source of Example 8 wherein the laser and modulator substrates form a single, common substrate, and the laser and modulator waveguides comprises form a single, common waveguide.

Example 11

The laser source of Example 10 wherein the primary modulation signal comprises a primary modulation current, and the modulator electrode is arranged so as to enable a superposition of a substantially constant modulator current $I_M$ and at least a portion of the primary modulation current to flow through a modulator electrode into or out of the modulator waveguide and produce time-varying optical gain or loss therein and thereby modulate the laser output to produce the modulated output optical signal.

Example 12

The laser source of any one of Examples 1 through 9 wherein the laser resonator and the optical modulator are optically coupled by propagation of at least a portion of the laser output along an optical fiber.

Example 13

The laser source of any one of Examples 1 through 9 wherein the laser resonator and the optical modulator are optically coupled by free-space propagation of at least a portion of the laser output between the laser resonator and the optical modulator.

Example 14

The laser source of any one of Examples 1 through 9 wherein the laser resonator and the optical modulator are optically coupled by butt-coupling between the laser resonator and the optical modulator.

Example 15

The laser source of any one of Examples 1 through 14 further comprising a wavelength-dithering current source arranged to provide a wavelength-dithering current that flows through the laser electrode in addition to the laser current $I_1$ that flows into the resonator segment of the waveguide and any secondary modulation current that flows into or out of the resonator segment of the waveguide.

Example 16

The laser source of any one of Examples 1 through 15 further comprising a second laser electrode positioned over at least a portion, of length $L_2$, of the resonator segment of the waveguide, the second laser electrode being arranged so as to enable a substantially constant laser current $I_2$ to flow through the second laser electrode into the resonator segment of the waveguide and produce optical gain therein.

Example 17

The laser source of Example 16 wherein a current density $I_1/L_1$ differs from a current density $I_2/L_2$.

Example 18

The laser source of any one of Examples 16 or 17 further comprising a second laser-electrode electrical circuit coupled to the second laser electrode and arranged so as to derive from the primary modulation signal a time-varying second laser-electrode secondary modulation current, and to enable the second laser-electrode secondary modulation current to flow through the second laser electrode into or out of the resonator segment of the waveguide in addition to the second laser current $I_2$ that flows into the resonator segment of the waveguide.

Example 19

The laser source of any one of Examples 16 through 18 further comprising a wavelength-dithering current source arranged to provide a wavelength-dithering current that flows through (1) the laser electrode in addition to the laser current $I_1$ that flows into the resonator segment of the waveguide and any secondary modulation current that flows into or out of the resonator segment of the waveguide through the laser electrode, or (2) the second laser electrode in addition to the second laser current $I_2$ that flows into the resonator segment of the waveguide and any secondary modulation current that flows into or out of the resonator segment of the waveguide through the second laser electrode.

Example 20

The laser source of any one of Examples 15 or 19 further comprising an optical fiber coupled to the laser source so as to receive at least a portion of the modulated output optical signal to propagate along the optical fiber, wherein an amplitude of the wavelength-dithering current is sufficiently large so that spectral broadening resulting therefrom results in at least partial suppression of stimulated Brillouin scattering of the modulated output optical signal propagating in the optical fiber.

Example 21

The laser source of any one of Examples 1 through 20 wherein the laser-electrode electrical circuit is arranged so that the laser-electrode secondary modulation current is derived from the primary modulation signal by corresponding scaling, phase-shifting, or filtering of a corresponding portion of the primary modulation signal.

Example 22

The laser source of any one of Examples 1 through 21 wherein the laser-electrode electrical circuit is arranged so that the laser-electrode secondary modulation current is a scaled, in-phase replica of the primary modulation signal.

Example 23

The laser source of any one of Examples 1 through 21 wherein the laser-electrode electrical circuit is arranged so that the laser-electrode secondary modulation current is a scaled, inverted replica of the primary modulation signal.

Example 24

The laser source of any one of Examples 1 through 23 wherein the laser-electrode electrical circuit includes one more adjustable or selectable circuit elements arranged so as to enable alteration of the laser-electrode secondary modulation current.

Example 25

The laser source of any one of Examples 1 through 24 wherein the laser-electrode electrical circuit is arranged so as to increase or maximize, with respect to adjustment or selection of one or more circuit elements thereof, a carrier-to-noise ratio for the modulated output optical signal propagated through a specified length of an optical fiber, relative to a carrier-to-noise ratio of the modulated optical signal in the absence of the laser-electrode secondary modulation current.

Example 26

The laser source of any one of Examples 1 through 25 wherein the laser-electrode electrical circuit is arranged so as to reduce or minimize, with respect to adjustment or selection of one or more circuit elements thereof, frequency chirp of the modulated output optical signal, relative to frequency chirp of the modulated optical signal in the absence of the laser-electrode secondary modulation current.

Example 27

The laser source of any one of Examples 1 through 26 wherein the laser-electrode electrical circuit includes a resistor or a capacitor in series between the laser electrode and a source of the primary modulation signal.

Example 28

The laser source of any one of Examples 1 through 27 wherein the laser-electrode electrical circuit includes a p-i-n diode in series between the laser electrode and a source of the primary modulation signal.

Example 29

A method for operating laser source of any one of Examples 1 through 28, the method comprising: (A) applying the laser current $I_1$ to the resonator segment of the waveguide through the laser electrode, thereby producing the laser output to be received by the optical modulator; and (B) applying the primary modulation signal to the modulator, thereby (i) modulating the laser output to form the modulated output optical signal and (ii) applying the laser-electrode secondary modulation current to the resonator segment of the waveguide through the laser electrode.

Example 30

The method of Example 29 further comprising (C) adjusting or selecting one or more elements of the laser-electrode electrical circuit to maximize a carrier-to-noise ratio of the modulated output optical signal, or to minimize a frequency chirp of the modulated output optical signal, with respect to the adjustment or selection of the one or more circuit elements, relative to a carrier-to-noise ratio or frequency chirp, respectively, of the modulated optical signal in the absence of the laser-electrode secondary modulation current.

Example 31

A method for fabricating the laser source of any one of Examples 1 through 28, the method comprising: (A) forming the optical waveguide on the substrate; (B) arranging the optical reflectors on the substrate or waveguide; (C) forming the laser electrode over at least a portion of the resonator segment of the waveguide; (D) arranging the optical modulator to receive at least a portion of the laser output, and to modulate the laser output, in response to the time-varying primary modulation signal applied to the optical modulator, to produce the modulated output optical signal; and (E) coupling the laser-electrode electrical circuit to the laser electrode and arranging the laser-electrode electrical circuit to derive from the primary modulation signal the time-varying laser-electrode secondary modulation current, and to enable the laser-electrode secondary modulation current to flow through the laser electrode into or out of the resonator segment of the waveguide in addition to the laser current $I_1$ that flows into the resonator segment of the waveguide.

Example 32

The method of Example 31 further comprising: (F) connecting the laser electrode to a source of the first laser current $I_1$; and (G) coupling the modulator to a source of the primary modulation signal.

Example 33

The method of Example 32 further comprising (H) adjusting or selecting one or more elements of the laser-electrode electrical circuit to maximize a carrier-to-noise ratio of the modulated output optical signal, or to minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser electrode secondary modulation currents.

Example 34

A modulated semiconductor laser source comprising: (a) a semiconductor substrate; (b) an optical waveguide formed on the substrate and arranged so as to provide position-dependent optical gain or loss, for an optical signal within an operating wavelength range of the laser source that propagates along the waveguide, that varies according to a position-dependent level of electrical current density flowing into or out of the optical waveguide; (c) an optical reflector arranged on the substrate or waveguide so as to reflect, to propagate along the waveguide in a forward direction, at least a portion of an optical signal propagating along the waveguide in a rearward direction within the operating wavelength range; (d) an optical grating arranged on the substrate or waveguide so as to diffract, to propagate in the rearward direction along the waveguide toward the reflector, at least a portion of an optical signal propagating along the waveguide in the forward direction within the operating wavelength range, wherein the waveguide, reflector, and grating define a laser resonator arranged so that laser output from the laser resonator propagates in the forward direction from the grating along the waveguide; (e) a first laser electrode positioned over a first segment, of length $L_1$, of the waveguide between the reflector and the grating, the first laser electrode being arranged so as to enable a substantially constant first laser current $I_1$ to flow through the first laser electrode into the first segment of the waveguide and produce optical gain therein; (f) a second laser electrode positioned over a second segment, of length $L_2$, of the waveguide that includes at least a portion of the grating, the second laser electrode being arranged so as to enable a substantially constant second laser current $I_2$ to flow through the second laser electrode into the second segment of the waveguide and produce optical gain therein; and (g) a modulator electrode positioned over a third segment of the waveguide forward of the grating, the modulator electrode being arranged so as to enable a superposition of a substantially constant modulator current $I_M$ and at least a portion of a time-varying primary modulation current to flow through the modulator electrode into or out of the third segment of the waveguide and produce time-varying optical gain or loss therein and thereby modulate the laser output to produce a modulated output optical signal, and one or both of: (h) a first-laser-electrode electrical circuit coupling the first laser electrode and the modulator electrode so as to derive from the primary modulation current a time-varying first-laser-electrode secondary modulation current, and to enable the first-laser-electrode secondary modulation current to flow through the first laser electrode into or out of the first segment of the waveguide in addition to the first laser current $I_1$ that flows into the first segment of the waveguide; or (i) a second-laser-electrode electrical circuit coupling the second laser electrode and the modulator electrode so as to derive from the primary modulation current a time-varying second-laser-electrode secondary modulation current, and to enable the second-laser-electrode secondary modulation current to flow through the second laser electrode into or out of the second segment of the waveguide in addition to the second laser current $I_2$ that flows into the second segment of the waveguide.

Example 35

The laser source of Example 34 wherein the laser source includes only one of the first- or second-laser-electrode electrical circuits.

Example 36

The laser source of Example 34 wherein the laser source includes both of the first- and second-laser-electrode electrical circuits.

Example 37

The laser source of any one of Examples 16 through 19 or 34 through 36 wherein at least one of the first- or second-laser-electrode electrical circuits is arranged so that the corresponding first- or second-laser-electrode secondary modulation current is derived from the primary modulation current by corresponding scaling, phase-shifting, or filtering of a corresponding portion of the primary modulation current.

Example 38

The laser source of Example 37 wherein at least one of the first- or second-laser-electrode electrical circuits is arranged so that the corresponding first- or second-laser-electrode secondary modulation current is a scaled, in-phase replica of the primary modulation current.

Example 39

The laser source of any one of Examples 37 or 38 wherein at least one of the first- or second-laser-electrode electrical circuits is arranged so that the corresponding first- or second-laser-electrode secondary modulation current is a scaled, inverted replica of the primary modulation current.

Example 40

The laser source of any one of Examples 16 through 19 or 34 through 39 wherein at least one of the first- or second-laser-electrode electrical circuits includes one more adjustable or selectable circuit elements arranged so as to enable alteration of the corresponding first- or second-laser-electrode secondary modulation current.

Example 41

The laser source of Example 40 wherein at least one of the first- or second-laser-electrode electrical circuits is arranged so as to increase or maximize, with respect to adjustment or selection of one or more circuit elements thereof, a carrier-to-noise ratio for the modulated output optical signal propagated through a specified length of an optical fiber, relative to a carrier-to-noise ratio of the modulated optical signal in the absence of the first- and second-laser-electrode secondary modulation currents.

Example 42

The laser source of any one of Examples 40 or 41 wherein at least one of the first- or second-laser-electrode electrical circuits is arranged so as to reduce or minimize, with respect to adjustment or selection of one or more circuit elements thereof, frequency chirp of the modulated output optical signal, relative to frequency chirp of the modulated optical signal in the absence of the first- and second-laser-electrode secondary modulation currents.

Example 43

The laser source of any one of Examples 16 through 19 or 34 through 42 wherein at least one of the first- or second-laser-electrode electrical circuits includes a resistor or a capacitor in series between the modulator electrode and the corresponding one of the first or second laser electrodes.

Example 44

The laser source of any one of Examples 16 through 19 or 34 through 43 wherein at least one of the first- or second-laser-electrode electrical circuits includes a p-i-n diode in series between the modulator electrode and the corresponding one of the first or second laser electrodes.

Example 45

The laser source of any one of Examples 16 through 19 or 34 through 44 wherein the first laser electrode and the second laser electrode are electrically separated by a vertical gap formed in semiconductor material between those electrodes.

Example 46

The laser source of any one of Examples 11 or 34 through 45 wherein the second laser electrode and the modulator electrode are electrically separated by a vertical gap formed in semiconductor material between those electrodes.

Example 47

The laser source of any one of Examples 11 or 34 through 46 wherein a current density $I_1/L_1$ differs from a current density $I_2/L_2$.

Example 48

The laser source of Example 47 wherein $I_1/L_1 > I_2/L_2$.

Example 49

The laser source of Example 48 wherein $I_1/L_1$ is more than about 1.5 times greater than $I_2/L_2$.

Example 50

The laser source of any one of Examples 16 through 19 or 34 through 49 wherein $L_2 > L_1$.

Example 51

The laser source of Example 50 wherein $L_2$ is more than about three times longer than $L_1$.

Example 52

The laser source of any one of Examples 1 through 51 wherein the substrate includes InP and the waveguide includes one or more III-V semiconductor materials.

Example 53

The laser source of any one of Examples 1 through 52 wherein the waveguide includes a multi-quantum-well structure or a heterostructure.

Example 54

The laser source of any one of Examples 8 or 9 wherein the modulator substrate includes InP and the modulator waveguide includes one or more III-V semiconductor materials.

Example 55

The laser source of Example 54 wherein the modulator waveguide includes a multi-quantum-well structure or a heterostructure.

Example 56

The laser source of any one of Examples 1 through 55 wherein the operating wavelength range is: (i) between about 400 nm and about 2500 nm; (ii) between about 800 nm and about 900 nm; (iii) between about 1200 nm and about 1700 nm; (iv) between about 1520 nm and about 1570 nm, or (v) between about 1570 nm and about 1620 nm.

Example 57

The laser source of any one of Examples 11 or 34 through 56 wherein the second laser current $I_2$ and the modulator current $I_M$ result in a positive voltage on the second laser electrode that is larger than a positive voltage on the modulator electrode.

Example 58

The laser source of any one of Examples 34 through 57 further comprising a wavelength-dithering current source arranged to provide a wavelength-dithering current that flows (1) through the first laser electrode in addition to the first laser current $I_1$ that flows into the first segment of the waveguide and any secondary modulation current that flows into or out of the first segment of the waveguide, or (2) through the second laser electrode in addition to the second laser current $I_2$ that flows into the second segment of the waveguide and any secondary modulation current that flows into or out of the second segment of the waveguide.

Example 59

The laser source of any one of Examples 1 through 58 further comprising a modulation signal source connected to the modulator electrode and arranged so as to provide the primary modulation signal or current that includes an information-carrying modulation signal.

Example 60

The laser source of any one of Examples 15, 19, 20, or 58 further comprising a modulation signal source connected to the modulator electrode and arranged so as to provide the primary modulation signal or current that includes an information-carrying modulation signal.

Example 61

The laser source of Example 60 wherein the information-carrying modulation signal includes information-carrying frequency components only between about 50 MHz and about 1.2 GHz.

Example 62

The laser source of any one of Examples 60 or 61 wherein the wavelength-dithering current substantially lacks any frequency component at a frequency that is greater than about 15 MHz and less than about 2.4 GHz.

Example 63

The laser source of any one of Examples 60 through 62 wherein at least a portion of the wavelength-dithering current oscillates at a frequency that is greater than about two times any information-carrying frequency component of the information-carrying modulation signal.

Example 64

The laser source of any one of Examples 60 through 63 wherein at least a portion of the wavelength-dithering current oscillates at a frequency that is less than about one third of any information-carrying frequency component of the information-carrying modulation signal.

Example 65

The laser source of any one of Examples 60 through 64 wherein the wavelength-dithering current substantially lacks any frequency component at a frequency that is greater than about one third of, and less than about two times, any information-carrying frequency component of the information-carrying modulation signal.

Example 66

The laser source of any one of Examples 60 through 65 wherein at least a portion of the wavelength-dithering current oscillates at a frequency that is less than about 15 MHz.

Example 67

The laser source of any one of Examples 60 through 66 wherein at least a portion of the wavelength-dithering signal oscillates at a frequency that is greater than about 2.4 GHz and flows through the first or second laser electrode.

Example 68

The laser source of any one of Examples 60 through 67 further comprising an optical fiber coupled to the laser source so as to receive at least a portion of the modulated output optical signal to propagate along the optical fiber, wherein an amplitude of the wavelength-dithering current is sufficiently large so that spectral broadening resulting therefrom results in at least partial suppression of stimulated Brillouin scattering of the modulated output optical signal propagating in the optical fiber.

Example 69

The laser source of any one of Examples 11 or 34 through 68 wherein the waveguide is characterized by an estimated optical gain peak wavelength that is longer than the operating wavelength range.

Example 70

The laser source of Example 69 wherein the estimated gain peak is a peak wavelength of an electroluminescence spectrum of the third segment of the waveguide measured without any laser output and at an input voltage applied to the modulator electrode about equal to an open-circuit voltage produced by transmission of the laser output through the third segment of the waveguide.

Example 71

The laser source of any one of Examples 70 or 71 wherein operating wavelength range is more than about 10 nm shorter than the estimated optical gain peak wavelength.

Example 72

A method for operating laser source of any one of Examples 34 through 71, the method comprising: (A) applying the first laser current $I_1$ to the first segment of the waveguide through the first laser electrode and applying the second laser current $I_2$ to the second segment of the waveguide through the second laser electrode, thereby producing the laser output to propagate in the forward direction along the waveguide; and (B) applying the modulator current $I_M$ and the primary modulation current to the third segment of the waveguide through the modulator electrode, thereby (i) modulating the laser output to form the modulated output optical signal and (ii) applying at least one of the first- or second-laser-electrode secondary modulation currents to the corresponding first or second segment of the waveguide through the corresponding first or second laser electrode.

Example 73

The method of Example 72 further comprising (C) adjusting or selecting one or more elements of at least one of the first- or second-laser-electrode electrical circuits to maximize a carrier-to-noise ratio of the modulated output optical signal, or to minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser-electrode secondary modulation currents.

Example 74

A method for fabricating the laser source of any one of Examples 34 through 71, the method comprising: (A) forming the optical waveguide on the substrate; (B) arranging the optical reflector on the substrate or waveguide; (C) arranging the optical grating on the substrate or waveguide; and (D) forming the first laser electrode, the second laser electrode, and the modulator electrode over the first, second, and third segments of the waveguide, respectively, and one or both of: (E) coupling the first laser electrode and the modulator electrode with the first-laser-electrode electrical circuit; and (F) coupling the second laser electrode and the modulator electrode with the second-laser-electrode electrical circuit.

Example 75

The method of Example 74 further comprising: (G) connecting the first laser electrode to a source of the first laser current $I_1$; (H) connecting the second laser electrode to a source of the second laser current $I_2$; and (I) connecting the modulator electrode to a source of the modulator current $I_M$ and to a source of the primary modulation current.

Example 76

The method of Example 75 further comprising (J) adjusting or selecting one or more elements of at least one of the first- or second-laser-electrode electrical circuits to maximize a carrier-to-noise ratio of the modulated output optical signal, or to minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser electrode secondary modulation currents.

It is intended that equivalents of the disclosed example embodiments and methods shall fall within the scope of the present disclosure or appended claims. It is intended that the disclosed example embodiments and methods, and equivalents thereof, may be modified while remaining within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of a single disclosed example embodiment. Thus, the appended claims are hereby incorporated into the Detailed Description, with each claim standing on its own as a separate disclosed embodiment. However, the present disclosure shall also be construed as implicitly disclosing any embodiment having any suitable set of one or more disclosed or claimed features (i.e., a set of features that are neither incompatible nor mutually exclusive) that appear in the present disclosure or the appended claims, including those sets that may not be explicitly disclosed herein. In addition, for purposes of disclosure, each of the appended dependent claims shall be construed as if written in multiple dependent form and dependent upon all preceding claims with which it is not inconsistent. It should be further noted that the scope of the appended claims does not necessarily encompass the whole of the subject matter disclosed herein.

For purposes of the present disclosure and appended claims, the conjunction "or" is to be construed inclusively (e.g., "a dog or a cat" would be interpreted as "a dog, or a cat, or both"; e.g., "a dog, a cat, or a mouse" would be interpreted as "a dog, or a cat, or a mouse, or any two, or all three"), unless: (i) it is explicitly stated otherwise, e.g., by use of "either . . . or," "only one of," or similar language; or (ii) two or more of the listed alternatives are mutually exclusive within the particular context, in which case "or" would encompass only those combinations involving non-mutually-exclusive alternatives. For purposes of the present disclosure and appended claims, the words "comprising," "including," "having," and variants thereof, wherever they appear, shall be construed as open ended terminology, with the same meaning as if the phrase "at least" were appended after each instance thereof, unless explicitly stated otherwise. For purposes of the present disclosure or appended claims, when terms are employed such as "about equal to," "substantially equal to," "greater than about," "less than about," and so forth, in relation to a numerical quantity, standard conventions pertaining to measurement precision and significant digits shall apply, unless a differing interpretation is explicitly set forth. For null quantities described by phrases such as "substantially prevented," "substantially lacks," "substantially absent," "substantially eliminated," "about equal to zero," "negligible," and so forth, each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

In the appended claims, any labelling of elements, steps, limitations, or other portions of a claim (e.g., first, second, etc., (a), (b), (c), etc., or (i), (ii), (iii), etc.) is only for purposes of clarity, and shall not be construed as implying any sort of ordering or precedence of the claim portions so labelled. If any such ordering or precedence is intended, it will be explicitly recited in the claim or, in some instances, it will be implicit or inherent based on the specific content of the claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A modulated semiconductor laser source comprising:
   (a) a semiconductor substrate;
   (b) an optical waveguide formed on the substrate and arranged so as to provide position-dependent optical gain or loss, for an optical signal within an operating wavelength range of the laser source that propagates along the waveguide, that varies according to a position-dependent level of electrical current density flowing into or out of the optical waveguide;
   (c) an optical reflector arranged on the substrate or waveguide so as to reflect, to propagate along the waveguide in a forward direction, at least a portion of an optical signal propagating along the waveguide in a rearward direction within the operating wavelength range;
   (d) an optical grating arranged on the substrate or waveguide so as to diffract, to propagate in the rearward direction along the waveguide toward the reflector, at least a portion of an optical signal propagating along the waveguide in the forward direction within the operating wavelength range, wherein the waveguide, reflector, and grating define a partial-grating DFB laser resonator arranged so that laser output from the laser resonator propagates in the forward direction from the grating along the waveguide;
   (e) a first laser electrode positioned over a first segment, of length $L_1$, of the waveguide that lies between the reflector and the grating and from at least a portion of which the grating is absent, the first laser electrode being arranged so as to enable a substantially constant first laser current $I_1$ to flow through the first laser electrode into the first segment of the waveguide and produce optical gain therein;
   (f) a second laser electrode positioned over a second segment, of length $L_2$, of the waveguide that includes at least a portion of the grating, the second laser electrode being arranged so as to enable a substantially constant second laser current $I_2$ to flow through the second laser electrode into the second segment of the waveguide and produce optical gain therein;
   (g) an optical modulator optically coupled to the laser resonator so as to receive at least a portion of the laser output and to modulate the laser output, in response to a time-varying primary modulation signal applied to the optical modulator, to produce a modulated output optical signal;
   (h) a first-laser-electrode electrical circuit arranged for coupling the first laser electrode and the modulator electrode and so as to derive from the primary modulation signal a time-varying first-laser-electrode secondary modulation current, and to enable the first-laser-electrode secondary modulation current to flow through the first laser electrode into or out of the first segment of the waveguide in addition to the first laser current $I_1$ that flows into the first segment of the waveguide, and
   (i) a second-laser-electrode electrical circuit arranged for coupling the second laser electrode and the modulator electrode and so as to derive from the primary modulation current a time-varying second-laser-electrode secondary modulation current, and to enable the second-laser-electrode secondary modulation current to flow through the second laser electrode into or out of the second segment of the waveguide in addition to the second laser current $I_2$ that flows into the second segment of the waveguide.

2. The laser source of claim 1 wherein the reflector is positioned on an edge facet of the substrate.

3. The laser source of claim 1 wherein the reflector comprises a distributed Bragg reflector formed in or on the substrate or waveguide.

4. The laser source of claim 1 wherein the optical modulator comprises:
(i) a modulator optical waveguide formed on a modulator semiconductor substrate, the modulator waveguide being arranged so as to receive the laser output to propagate along the modulator waveguide; and
(k) a modulator electrode positioned over at least a portion of the modulator waveguide, the modulator electrode being arranged so as to alter optical gain or loss of the laser output propagating along the modulator waveguide in response to the primary modulation signal applied to the modulator electrode and thereby modulate the laser output to produce the modulated output optical signal.

5. The laser source of claim 4 wherein the laser and modulator substrates form a single, common substrate, and the laser and modulator waveguides comprises form a single, common waveguide.

6. The laser source of claim 5 wherein the primary modulation signal comprises a primary modulation current, and the modulator electrode is arranged so as to enable a superposition of a substantially constant modulator current $I_M$ and at least a portion of the primary modulation current to flow through a modulator electrode into or out of the modulator waveguide and produce time-varying optical gain or loss therein and thereby modulate the laser output to produce the modulated output optical signal.

7. The laser source of claim 1 wherein a current density $I_1/L_1$ differs from a current density $I_2/L_2$.

8. The laser source of claim 1 further comprising a wavelength-dithering current source arranged to provide a wavelength-dithering current that flows through (1) the first laser electrode in addition to the first laser current $I_1$ that flows into the first resonator segment of the waveguide and any secondary modulation current that flows into or out of the resonator segment of the waveguide through the laser electrode, or (2) the second laser electrode in addition to the second laser current $I_2$ that flows into the resonator segment of the waveguide and any secondary modulation current that flows into or out of the resonator segment of the waveguide through the second laser electrode.

9. The laser source of claim 8 further comprising an optical fiber coupled to the laser source so as to receive at least a portion of the modulated output optical signal to propagate along the optical fiber, wherein an amplitude of the wavelength-dithering current is sufficiently large so that spectral broadening resulting therefrom results in at least partial suppression of stimulated Brillouin scattering of the modulated output optical signal propagating in the optical fiber.

10. The laser source of claim 1 wherein at least one of the first- or second-laser-electrode electrical circuits is arranged so that the corresponding first- or second-laser-electrode secondary modulation current is derived from the primary modulation signal by corresponding scaling, phase-shifting, or filtering of a corresponding portion of the primary modulation signal.

11. The laser source of claim 10 wherein at least one of the first- or second-laser-electrode electrical circuits is arranged so that the corresponding first- or second-laser-electrode secondary modulation current is a scaled, in-phase replica of the primary modulation signal.

12. The laser source of claim 10 wherein at least one of the first- or second-laser-electrode electrical circuits is arranged so that the corresponding first- or second-laser-electrode secondary modulation current is a scaled, inverted replica of the primary modulation signal.

13. The laser source of claim 1 wherein at least one of the first- or second-laser-electrode electrical circuits includes one more adjustable or selectable circuit elements arranged so as to enable alteration of the corresponding laser-electrode secondary modulation current.

14. The laser source of claim 13 wherein at least one of the first- or second-laser-electrode electrical circuits is arranged so as to (i) increase or maximize, with respect to adjustment or selection of one or more circuit elements thereof, a carrier-to-noise ratio for the modulated output optical signal propagated through a specified length of an optical fiber, relative to a carrier-to-noise ratio of the modulated optical signal in the absence of the first- and second-laser-electrode secondary modulation currents, or (ii) reduce or minimize, with respect to adjustment or selection of one or more circuit elements thereof, frequency chirp of the modulated output optical signal, relative to frequency chirp of the modulated optical signal in the absence of the first- and second-laser-electrode secondary modulation currents.

15. A method for operating laser source of claim 1, the method comprising:
(A) applying the first laser current $I_1$ to the first segment of the waveguide through the first laser electrode and applying the second laser current $I_2$ to the second segment of the waveguide through the second laser electrode, thereby producing the laser output to be received by the optical modulator; and
(B) applying the primary modulation signal to the modulator, thereby (i) modulating the laser output to form the modulated output optical signal and (ii) applying at least one of the first- or second-laser-electrode secondary modulation currents to the corresponding first or second segment of the waveguide through the corresponding first or second laser electrode.

16. The method of claim 15 further comprising adjusting or selecting one or more elements of at least one of the first- or second-laser-electrode electrical circuits to increase or maximize a carrier-to-noise ratio of the modulated output optical signal, or to reduce or minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser-electrode secondary modulation currents.

17. A method for fabricating the laser source of claim 1, the method comprising:
(A) forming the optical waveguide on the substrate;
(B) arranging the optical reflector on the substrate or waveguide;
(C) arranging the optical grating on the substrate or waveguide;
(D) forming the first and second laser electrodes over corresponding segments of the waveguide;
(E) arranging the optical modulator to receive at least a portion of the laser output, and to modulate the laser output, in response to the time-varying primary modulation signal applied to the optical modulator, to produce the modulated output optical signal;

(F) coupling the first laser electrode and the modulator electrode with the first-laser-electrode electrical circuit; and (G) coupling the second laser electrode and the modulator electrode with the second-laser-electrode electrical circuit.

18. The method of claim 17 further comprising:

(H) connecting the first laser electrode to a source of the first laser current $I_1$;

(I) connecting the second laser electrode to a source of the second laser current $I_2$; and (J) coupling the modulator to a source of the primary modulation signal.

19. The method of claim 18 further comprising adjusting or selecting one or more elements of at least one of the first- or second-laser-electrode electrical circuits to increase or maximize a carrier-to-noise ratio of the modulated output optical signal, or to reduce or minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser electrode secondary modulation currents.

20. The laser source of claim 6 wherein at least one of the first- or second-laser-electrode electrical circuits includes a p-i-n diode in series between the modulator electrode and the corresponding one of the first or second laser electrodes.

21. The laser source of claim 6 further comprising:

(j) a modulation signal source connected to the modulator electrode and arranged so as to provide the primary modulation current that includes an information-carrying modulation signal; and (k) a wavelength-dithering current source arranged to provide a wavelength-dithering current that flows (1) through the first laser electrode in addition to the first laser current $I_1$ that flows into the first segment of the waveguide and any secondary modulation current that flows into or out of the first segment of the waveguide, or (2) through the second laser electrode in addition to the second laser current $I_2$ that flows into the second segment of the waveguide and any secondary modulation current that flows into or out of the second segment of the waveguide.

22. The laser source of claim 21 wherein the information-carrying modulation signal includes information-carrying frequency components only between about 50 MHz and about 1.2 GHz, and the wavelength-dithering current substantially lacks any frequency component between about 15 MHz and about 2.4 GHz.

23. The laser source of claim 21 wherein the wavelength-dithering current substantially lacks any frequency component at a frequency that is greater than about one third of a minimum frequency of, and less than about two times a maximum frequency of, any information-carrying frequency component of the information-carrying modulation signal.

24. The laser source of claim 21 further comprising an optical fiber coupled to the laser source so as to receive at least a portion of the modulated output optical signal to propagate along the optical fiber, wherein an amplitude of the wavelength-dithering current is sufficiently large so that spectral broadening resulting therefrom results in at least partial suppression of stimulated Brillouin scattering of the modulated output optical signal propagating in the optical fiber.

25. The laser source of claim 6 wherein the waveguide is characterized by an estimated optical gain peak wavelength that is longer than the operating wavelength range.

26. A method for operating laser source of claim 6, the method comprising:

(A) applying the first laser current $I_1$ to the first segment of the waveguide through the first laser electrode and applying the second laser current $I_2$ to the second segment of the waveguide through the second laser electrode, thereby producing the laser output to propagate in the forward direction along the waveguide; and (B) applying the modulator current $I_M$ and the primary modulation current to the third segment of the waveguide through the modulator electrode, thereby (i) modulating the laser output to form the modulated output optical signal and (ii) applying at least one of the first- or second-laser-electrode secondary modulation currents to the corresponding first or second segment of the waveguide through the corresponding first or second laser electrode.

27. The method of claim 26 further comprising adjusting or selecting one or more elements of at least one of the first- or second-laser-electrode electrical circuits to increase or maximize a carrier-to-noise ratio of the modulated output optical signal, or to reduce or minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser-electrode secondary modulation currents.

28. A method for fabricating the laser source of claim 6, the method comprising:

(A) forming the optical waveguide on the substrate;

(B) arranging the optical reflector on the substrate or waveguide;

(C) arranging the optical grating on the substrate or waveguide; and (D) forming the first laser electrode, the second laser electrode, and the modulator electrode over the first, second, and third segments of the waveguide, respectively;

(E) coupling the first laser electrode and the modulator electrode with the first-laser-electrode electrical circuit; and (F) coupling the second laser electrode and the modulator electrode with the second-laser-electrode electrical circuit.

29. The method of claim 28 further comprising:

(G) connecting the first laser electrode to a source of the first laser current $I_1$;

(H) connecting the second laser electrode to a source of the second laser current $I_2$; and (I) connecting the modulator electrode to a source of the modulator current $I_M$ and to a source of the primary modulation current.

30. The method of claim 29 further comprising adjusting or selecting one or more elements of at least one of the first- or second-laser-electrode electrical circuits to increase or maximize a carrier-to-noise ratio of the modulated output optical signal, or to reduce or minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser electrode secondary modulation currents.

31. The laser source of claim 8 wherein an information-carrying portion of the primary modulation signal includes information-carrying frequency components only between about 50 MHz and about 1.2 GHz, and the wavelength-dithering current substantially lacks any frequency component between about 15 MHz and about 2.4 GHz.

32. The laser source of claim 8 wherein the wavelength-dithering current substantially lacks any frequency component at a frequency that is greater than about one third of a minimum frequency of, and less than about two times a maximum frequency of, any information-carrying frequency component of an information-carrying portion or the primary modulation signal.

33. A method for fabricating a modulated laser source, the method comprising:
(A) forming an optical waveguide on a substrate;
(B) arranging an optical reflector on the substrate or waveguide;
(C) arranging an optical grating on the substrate or waveguide;
(D) forming first and second laser electrodes over corresponding segments of the waveguide; and
(E) arranging an optical modulator to receive at least a portion of laser output, and to modulate the laser output, in response to a time-varying primary modulation signal applied to the optical modulator, to produce a modulated output optical signal;
and one or both of:
(F) coupling the first laser electrode and the modulator electrode with a first-laser-electrode electrical circuit; or
(G) coupling the second laser electrode and the modulator electrode with a second-laser-electrode electrical circuit,
wherein the laser source comprises:
(a) the semiconductor substrate;
(b) the optical waveguide formed on the substrate and arranged so as to provide position-dependent optical gain or loss, for an optical signal within an operating wavelength range of the laser source that propagates along the waveguide, that varies according to a position-dependent level of electrical current density flowing into or out of the optical waveguide;
(c) the optical reflector arranged on the substrate or waveguide so as to reflect, to propagate along the waveguide in a forward direction, at least a portion of an optical signal propagating along the waveguide in a rearward direction within the operating wavelength range;
(d) the optical grating arranged on the substrate or waveguide so as to diffract, to propagate in the rearward direction along the waveguide toward the reflector, at least a portion of an optical signal propagating along the waveguide in the forward direction within the operating wavelength range, wherein the waveguide, reflector, and grating define a partial-grating DFB laser resonator arranged so that the laser output from the laser resonator propagates in the forward direction from the grating along the waveguide;
(e) the first laser electrode positioned over the first segment, of length $L_1$, of the waveguide that lies between the reflector and the grating and from at least a portion of which the grating is absent, the first laser electrode being arranged so as to enable the substantially constant first laser current $I_1$ to flow through the first laser electrode into the first segment of the waveguide and produce optical gain therein;
(f) the second laser electrode positioned over the second segment, of length $L_2$, of the waveguide that includes at least a portion of the grating, the second laser electrode being arranged so as to enable the substantially constant second laser current $I_2$ to flow through the second laser electrode into the second segment of the waveguide and produce optical gain therein; and
(g) the optical modulator optically coupled to the laser resonator so as to receive at least a portion of the laser output and to modulate the laser output, in response to the primary modulation signal applied to the optical modulator, to produce the modulated output optical signal;
(h) the first-laser-electrode electrical circuit arranged for coupling the first laser electrode and the modulator electrode and so as to derive from the primary modulation signal a time-varying first-laser-electrode secondary modulation current, and to enable the first-laser-electrode secondary modulation current to flow through the first laser electrode into or out of the first segment of the waveguide in addition to the first laser current $I_1$ that flows into the first segment of the waveguide; and
(i) a second-laser-electrode electrical circuit arranged for coupling the second laser electrode and the modulator electrode and so as to derive from the primary modulation current a time-varying second-laser-electrode secondary modulation current, and to enable the second-laser-electrode secondary modulation current to flow through the second laser electrode into or out of the second segment of the waveguide in addition to the second laser current $I_2$ that flows into the second segment of the waveguide,
(j) wherein coupling of the modulator electrode to the first laser electrode through the first-laser-electrode electrical circuit, to the second laser electrode through the second-laser-electrode electrical circuit, or to both, is determined based on corresponding improvements of performance of the laser source, with respect to frequency chirp or carrier-to-noise ratio, provided by each of those couplings relative to laser source performance in the absence of the first- and second-laser-electrode electrical circuits.

34. The method of claim 33 further comprising:
(H) connecting the first laser electrode to a source of the first laser current $I_1$;
(I) connecting the second laser electrode to a source of the second laser current $I_2$; and
(J) coupling the modulator to a source of the primary modulation signal.

35. The method of claim 33 further comprising adjusting or selecting one or more elements of at least one of the first- or second-laser-electrode electrical circuits to increase or maximize a carrier-to-noise ratio of the modulated output optical signal, or to reduce or minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser electrode secondary modulation currents.

36. The method of claim 33 wherein the laser source includes only one of the first- or second-laser-electrode electrical circuits.

37. The method of claim 33 wherein the laser source includes both the first- and second-laser-electrode electrical circuits.

38. The method of claim 33 wherein:
(k) the optical modulator comprises a modulator optical waveguide formed on the substrate, and the laser and modulator waveguides form a single, common waveguide; and a modulator semiconductor substrate, the modulator waveguide being arranged so as to receive the laser output to propagate along the modulator waveguide;
(l) the laser source further comprises a modulator electrode positioned over at least a portion of the modulator waveguide, the modulator electrode being arranged so as to alter optical gain or loss of the laser output propagating along the modulator waveguide in response to the primary modulation signal applied to the modulator electrode and thereby modulate the laser output to produce the modulated output optical signal; and
(m) the primary modulation signal comprises a primary modulation current, and the modulator electrode is arranged so as to enable a superposition of a substantially constant modulator current $I_M$ and at least a portion of the primary modulation current to flow through a modulator electrode into or out of the modulator waveguide and produce time-varying optical gain or loss therein and thereby modulate the laser output to produce the modulated output optical signal.

39. A method for operating a modulated semiconductor laser source, the method comprising:
(A) applying a first laser current $I_1$ to a first segment of an optical waveguide through a first laser electrode and applying a second laser current $I_2$ to a second segment of the waveguide through a second laser electrode, thereby producing laser output to be received by an optical modulator; and
(B) applying a time-varying primary modulation signal to the modulator, thereby (i) modulating the laser output to form a modulated output optical signal and (ii) applying at least one of first- or second-laser-electrode secondary modulation currents to the corresponding first or second segment of the waveguide through the corresponding first or second laser electrode,
wherein the laser source comprises:
(a) a semiconductor substrate;
(b) the optical waveguide formed on the substrate and arranged so as to provide position-dependent optical gain or loss, for an optical signal within an operating wavelength range of the laser source that propagates along the waveguide, that varies according to a position-dependent level of electrical current density flowing into or out of the optical waveguide;
(c) an optical reflector arranged on the substrate or waveguide so as to reflect, to propagate along the waveguide in a forward direction, at least a portion of an optical signal propagating along the waveguide in a rearward direction within the operating wavelength range;
(d) an optical grating arranged on the substrate or waveguide so as to diffract, to propagate in the rearward direction along the waveguide toward the reflector, at least a portion of an optical signal propagating along the waveguide in the forward direction within the operating wavelength range, wherein the waveguide, reflector, and grating define a partial-grating DFB laser resonator arranged so that the laser output from the laser resonator propagates in the forward direction from the grating along the waveguide;
(e) the first laser electrode positioned over the first segment, of length $L_1$, of the waveguide that lies between the reflector and the grating and from at least a portion of which the grating is absent, the first laser electrode being arranged so as to enable the substantially constant first laser current $I_1$ to flow through the first laser electrode into the first segment of the waveguide and produce optical gain therein;
(f) the second laser electrode positioned over the second segment, of length $L_2$, of the waveguide that includes at least a portion of the grating, the second laser electrode being arranged so as to enable the substantially constant second laser current $I_2$ to flow through the second laser electrode into the second segment of the waveguide and produce optical gain therein;
(g) the optical modulator optically coupled to the laser resonator so as to receive at least a portion of the laser output and to modulate the laser output, in response to the primary modulation signal applied to the optical modulator, to produce the modulated output optical signal;
(h) a first-laser-electrode electrical circuit arranged for coupling the first laser electrode and the modulator electrode and so as to derive from the primary modulation signal a time-varying first-laser-electrode secondary modulation current, and to enable the first-laser-electrode secondary modulation current to flow through the first laser electrode into or out of the first segment of the waveguide in addition to the first laser current $I_1$ that flows into the first segment of the waveguide; and
(i) a second-laser-electrode electrical circuit arranged for coupling the second laser electrode and the modulator electrode and so as to derive from the primary modulation current a time-varying second-laser-electrode secondary modulation current, and to enable the second-laser-electrode secondary modulation current to flow through the second laser electrode into or out of the second segment of the waveguide in addition to the second laser current $I_2$ that flows into the second segment of the waveguide,
(j) wherein applying the first-laser-electrode secondary modulation current, the second-laser-electrode secondary modulation current, or both, is determined based on corresponding improvements of performance of the laser source, with respect to frequency chirp or carrier-to-noise ratio, provided by each of those secondary modulation currents relative to laser source performance in the absence of the first- and second-laser-electrode electrical circuits.

40. The method of claim 39 wherein at least one of the first- or second-laser-electrode electrical circuits includes one or more elements adjusted or selected so as to increase or maximize a carrier-to-noise ratio of the modulated output optical signal, or to reduce or minimize a frequency chirp of the modulated output optical signal, with respect to the adjustment or selection of the one or more circuit elements, relative to a carrier-to-noise ratio or frequency chirp, respectively, of the modulated optical signal in the absence of the first- and second-laser-electrode secondary modulation currents.

41. The method of claim 39 wherein the laser source includes only one of the first- or second-laser-electrode electrical circuits.

42. The method of claim 39 wherein the laser source includes both the first- and second-laser-electrode electrical circuits.

43. The method of claim 39 wherein:

(k) the optical modulator comprises a modulator optical waveguide formed on the substrate, and the laser and modulator waveguides form a single, common waveguide; and a modulator semiconductor substrate, the modulator waveguide being arranged so as to receive the laser output to propagate along the modulator waveguide;

(l) the laser source further comprises a modulator electrode positioned over at least a portion of the modulator waveguide, the modulator electrode being arranged so as to alter optical gain or loss of the laser output propagating along the modulator waveguide in response to the primary modulation signal applied to the modulator electrode and thereby modulate the laser output to produce the modulated output optical signal; and (m) the primary modulation signal comprises a primary modulation current, and the modulator electrode is arranged so as to enable a superposition of a substantially constant modulator current $I_M$ and at least a portion of the primary modulation current to flow through a modulator electrode into or out of the modulator waveguide and produce time-varying optical gain or loss therein and thereby modulate the laser output to produce the modulated output optical signal.

* * * * *